United States Patent
Li et al.

(10) Patent No.: US 12,176,939 B2
(45) Date of Patent: Dec. 24, 2024

(54) SYSTEM AND METHOD FOR SHARING CIRCUITRY BETWEEN TRANSMIT AND RECEIVE PATH

(71) Applicant: QUALCOMM INCORPORATED, San Diego, CA (US)

(72) Inventors: Jinbo Li, San Jose, CA (US); Sean Joel Lyn, Cupertino, CA (US); Ara Bicakci, Sunol, CA (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 17/324,378

(22) Filed: May 19, 2021

(65) Prior Publication Data
US 2022/0376731 A1 Nov. 24, 2022

(51) Int. Cl.
*H04B 1/40* (2015.01)
*H04B 1/04* (2006.01)
(Continued)

(52) U.S. Cl.
CPC ............. *H04B 1/40* (2013.01); *H04B 1/0458* (2013.01); *H04B 1/26* (2013.01); *H04L 5/14* (2013.01);
(Continued)

(58) Field of Classification Search
CPC .......... H04B 1/0458; H04B 1/26; H04B 1/38; H04B 1/40; H04B 1/403; H04B 1/408; H04B 1/44; H04B 1/48; H04B 1/581; H04L 5/14; H04L 5/1423; H04L 5/22; H04L 25/0266; H04L 25/0278; H04Q 11/04; H04Q 11/08
(Continued)

(56) References Cited

U.S. PATENT DOCUMENTS 5,590,412 A * 12/1996 Sawai ....................... H03F 3/72
455/86
2003/0193923 A1* 10/2003 Abdelgany ............ H04B 1/005
370/320
(Continued)

FOREIGN PATENT DOCUMENTS

| CN | 114268340 A | * | 4/2022 | |
| KR | 20090034234 A2 | * | 4/2009 | ........... H04B 1/0028 |
| WO | 2009047736 A1 | | 4/2009 | |

OTHER PUBLICATIONS

International Search Report and Written Opinion—PCT/US2022/026440—ISA/EPO—Sep. 9, 2022.

*Primary Examiner* — Young T. Tse
(74) *Attorney, Agent, or Firm* — Smith Tempel Blaha LLC/Qualcomm Incorporated

(57) ABSTRACT

A transceiver circuit includes transmit circuitry comprising a transmit baseband filter and a driver amplifier having an output coupled to a power amplifier, receive circuitry comprising a low noise amplifier and a receive baseband filter, mixer circuitry and a magnetic circuit, wherein the mixer circuitry and the magnetic circuit are coupled between the transmit baseband filter and the driver amplifier, and are further coupled between the low noise amplifier and the receive baseband filter, wherein the mixer circuitry and the magnetic circuit are shared between the transmit circuitry and the receive circuitry in a time division duplexing (TDD) communication system.

30 Claims, 14 Drawing Sheets

(51) Int. Cl.
*H04B 1/26* (2006.01)
*H04L 5/14* (2006.01)
*H04L 25/02* (2006.01)
*H04Q 11/04* (2006.01)

(52) U.S. Cl.
CPC ......... *H04L 25/0266* (2013.01); *H04Q 11/04* (2013.01)

(58) Field of Classification Search
USPC ....... 375/219, 220, 257, 258, 281, 283–285; 370/278, 280, 282, 294; 455/501, 63.1, 455/78, 86
See application file for complete search history.

(56) References Cited

U.S. PATENT DOCUMENTS

| | | | |
|---|---|---|---|
| 2007/0040605 A1* | 2/2007 | Fan | H03H 7/0153 327/554 |
| 2008/0002597 A1 | 1/2008 | Fan et al. | |
| 2010/0120369 A1* | 5/2010 | Ko | H04B 1/40 455/67.11 |
| 2011/0279184 A1* | 11/2011 | Chan | H03F 3/195 330/277 |
| 2015/0229463 A1* | 8/2015 | Oh | H04B 1/48 370/278 |
| 2015/0333941 A1* | 11/2015 | Pan | H04L 27/063 455/257 |
| 2016/0352496 A1 | 12/2016 | Sjoland | |
| 2018/0226932 A1* | 8/2018 | Beaudin | H04W 52/0261 |
| 2019/0207558 A1* | 7/2019 | Mittal | H03D 7/165 |
| 2020/0099144 A1* | 3/2020 | Liu | H04B 7/0617 |
| 2020/0314751 A1* | 10/2020 | Liu | H04W 52/0229 |
| 2021/0194565 A1* | 6/2021 | Paramesh | H04B 1/0028 |

* cited by examiner

SYSTEM AND METHOD FOR SHARING CIRCUITRY BETWEEN TRANSMIT AND RECEIVE PATH

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. One of the circuits which may be involved in the processing of a communication signal is a magnetic circuit. A magnetic circuit may be used in the transmit path to provide amplifier input matching, and a magnetic circuit may be used in the receive path to provide low noise amplifier (LNA) output matching. A magnetic circuit may comprise inductive and capacitive elements. The inductive elements may comprise one or more inductors and one or more transformers. Transformers may also work with capacitances to allow the magnetic circuit to resonate at particular frequencies. Other circuits which may be involved in the processing of a communication signal may include mixer circuits, local oscillator circuits, and filter circuits.

Typically, in a communication device, the transmit path comprises signal upconversion circuitry and one or more magnetic circuits, and the receive path comprises signal downconversion circuitry and one or more magnetic circuits. The physical size of a magnetic circuit generally does not scale with the size of the circuit elements fabricated using a given semiconductor manufacturing process or technology. This is generally due to the relatively large physical size of the inductive elements, including inductive coils or slab inductors, that are used in the magnetic circuits. As communication devices continue to evolve, it is generally desirable to minimize the size of these devices.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a transceiver circuit including transmit circuitry comprising a transmit baseband filter and a driver amplifier having an output coupled to a power amplifier, receive circuitry comprising a low noise amplifier and a receive baseband filter, mixer circuitry and a magnetic circuit, wherein the mixer circuitry and the magnetic circuit are coupled between the transmit baseband filter and the driver amplifier, and are further coupled between the low noise amplifier and the receive baseband filter, wherein the mixer circuitry and the magnetic circuit are shared between the transmit circuitry and the receive circuitry in a time division duplexing (TDD) communication system.

Another aspect of the disclosure provides a method for communication including communicating a transmit signal in a transmit mode, communicating a receive signal in a receive mode, and using shared circuitry coupled between a low noise amplifier and a first baseband filter and further coupled between a second baseband filter and a driver amplifier to process the transmit signal in the transmit mode and the receive signal in the receive mode.

Another aspect of the disclosure provides a device including means for communicating a transmit signal in a transmit mode, means for communicating a receive signal in a receive mode, and means for using shared circuitry coupled between a low noise amplifier and a first baseband filter and further coupled between a second baseband filter and a driver amplifier to process the transmit signal in the transmit mode and the receive signal in the receive mode.

Another aspect of the disclosure provides a transceiver circuit including transmit circuitry, receive circuitry, and mixer circuitry coupled to the transmit circuitry and the receive circuitry and configured to operate in both a transmit mode and a receive mode, and a magnetic circuit coupled to the transmit circuitry and to the receive circuitry, the magnetic circuit configured to operate as a voltage step-up circuit in the transmit mode, and configured to operate as a current step-up or current maintenance circuit in the receive mode.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a modern wireless communication device, it is generally desirable to minimize the size of the components in the device, which may lead to overall device size reduction and reduced power consumption. However, it is generally difficult to reduce the size of a magnetic circuit in a communication device because of the size of the inductances that comprise many magnetic circuits.

Exemplary embodiments of the disclosure are directed to a system and method for sharing circuitry between a transmit path and a receive path in a communication device, which may reduce the overall size of the transmit and receive circuitry. This may be accomplished by combining, reusing, and/or sharing circuitry, such as mixer circuitry, local oscillator circuitry, and magnetic circuitry, for both the transmit path and the receive path.

In an exemplary embodiment, the system and method for sharing circuitry between transmit and receive paths in a communication device uses a shared magnetic circuit to provide both amplifier input impedance matching in a transmit path and low noise amplifier (LNA) output impedance matching in a receive path.

In an exemplary embodiment, the system and method for sharing circuitry between transmit and receive paths in a communication device may include sharing of at least some of the upconversion and downconversion circuitry between the transmit path and the receive path. For example, in some embodiments it is possible to share one or more of a mixer circuit, a local oscillator (LO) circuit, and one or more filter circuits between the transmit path and the receive path.

In an exemplary embodiment, the system and method for sharing circuitry between transmit and receive paths in a communication device can be implemented in any time division duplex (TDD) communication system.

In an exemplary embodiment, the system and method for sharing circuitry between transmit and receive paths in a communication device may be used in either a super-heterodyne transceiver architecture or a direct-conversion transceiver architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband (or near baseband) in one stage, and may comprise a zero-IF (or low-IF) architecture.

Figure 1:
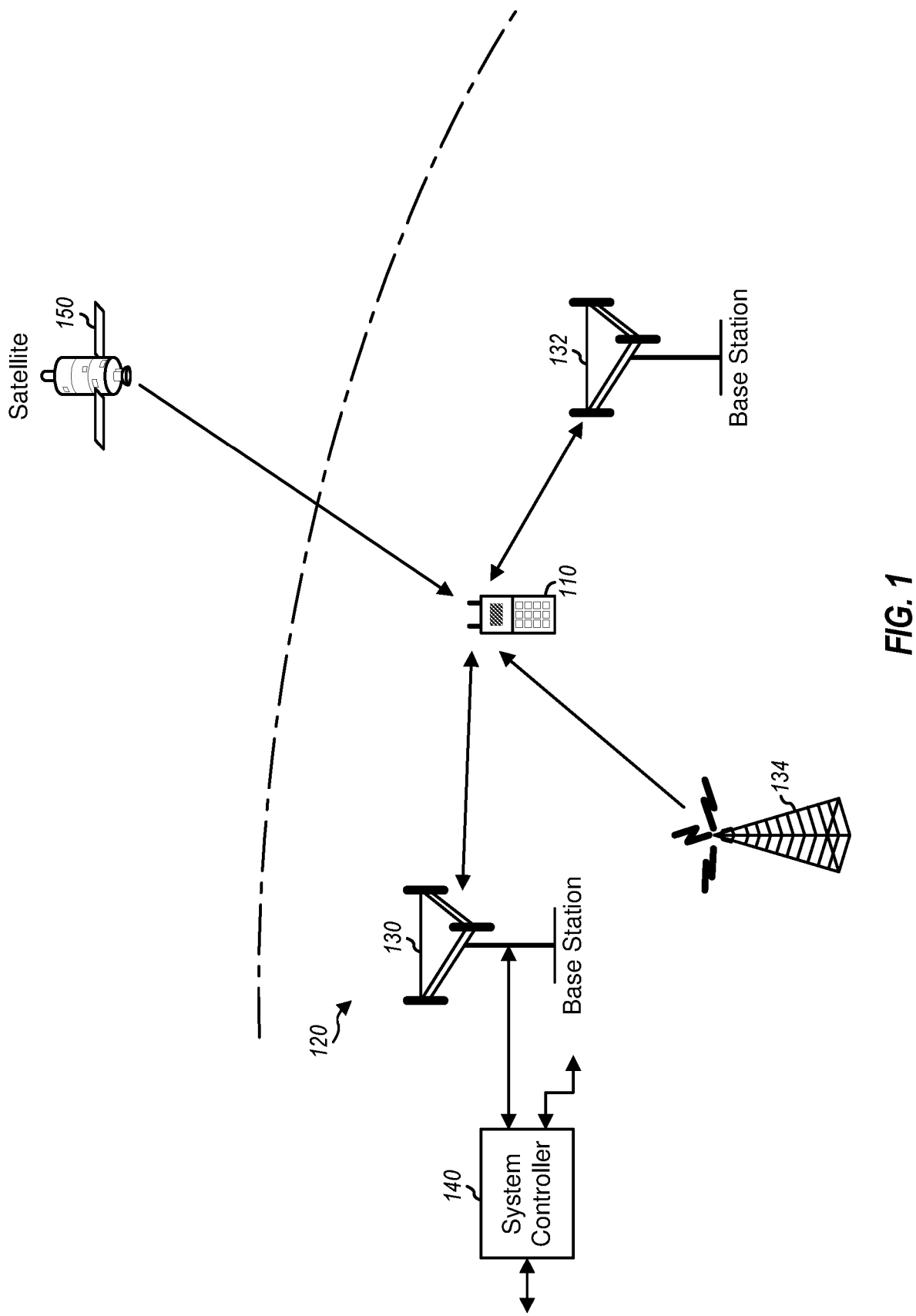
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, Bluetooth, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G, Bluetooth, or other communication bands, over a wide range of frequencies. Wireless device 110 may additionally or alternatively be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
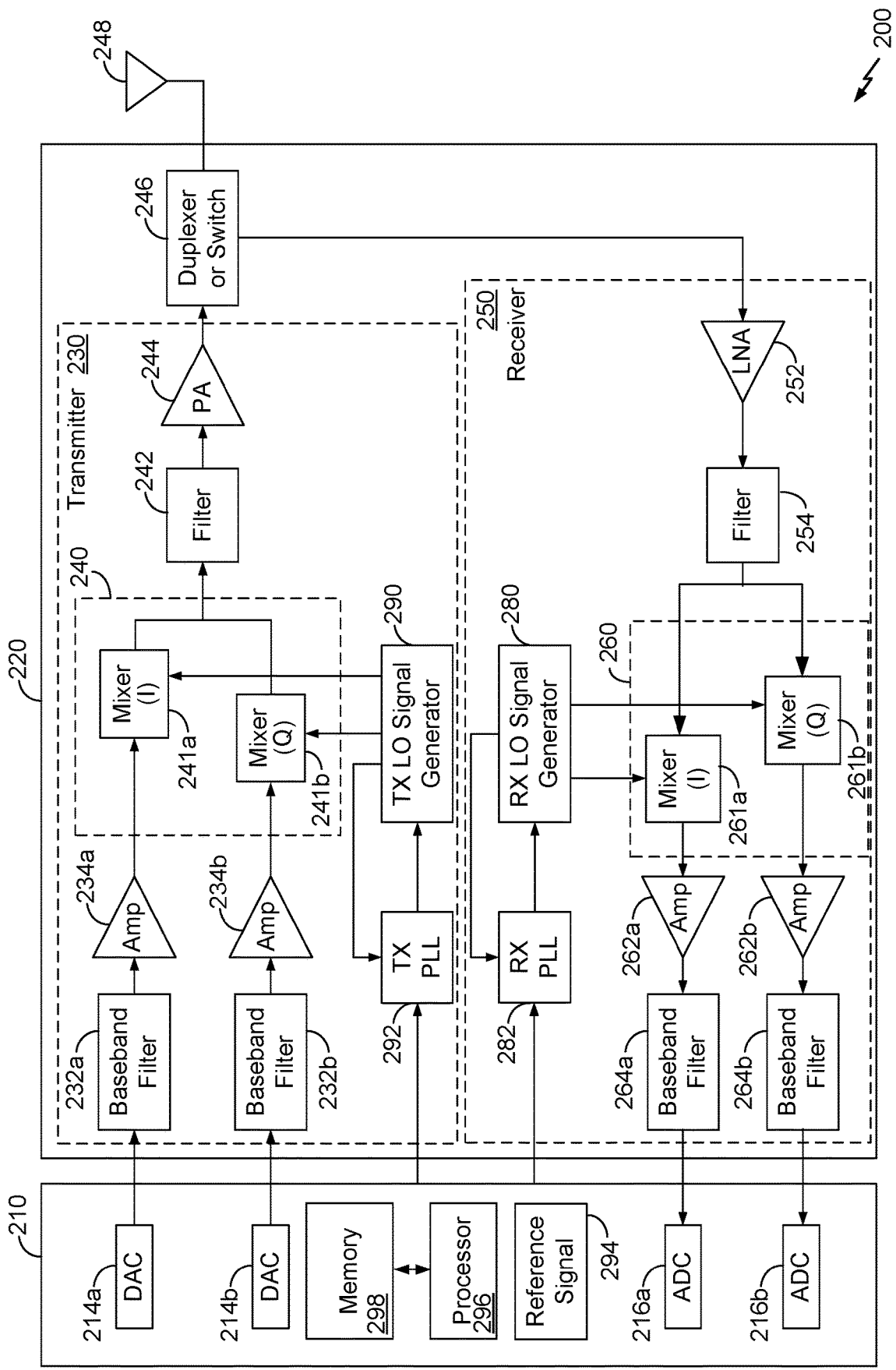
FIG. 2 is a block diagram showing a wireless device in which the exemplary techniques of the present disclosure may be implemented.

FIG. 2 is a block diagram showing a wireless device 200 in which exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RFICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, lowpass filters 232*a* and 232*b* filter the I and Q analog transmit signals, respectively, to remove undesired images caused by the prior digital-to-analog conversion Amplifiers (Amp) 234*a* and 234*b* amplify the signals from lowpass filters 232*a* and 232*b*, respectively, and provide I and Q baseband signals. An upconverter 240 upconverts the I and Q baseband signals (for example using mixers 241*a*, 241*b*) with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by lowpass filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, a reference signal element 294 may be located in the data processor 210 or elsewhere in the wireless communication device 200 and be configured to provide a reference signal to the RX PLL 282 and the TX PLL 292. In some embodiments, a reference signal element 294 is implemented separate from the data processor 210 and/or is configured to generate a reference signal based on a signal from an oscillator, for example a crystal oscillator.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency. In an exemplary embodiment, the system and method for sharing a common magnetic circuit between transmit and receive paths in a communication device can be implemented with a driver amplifier, a power amplifier, such as the power amplifier 244, or another amplifier.

Figure 3:
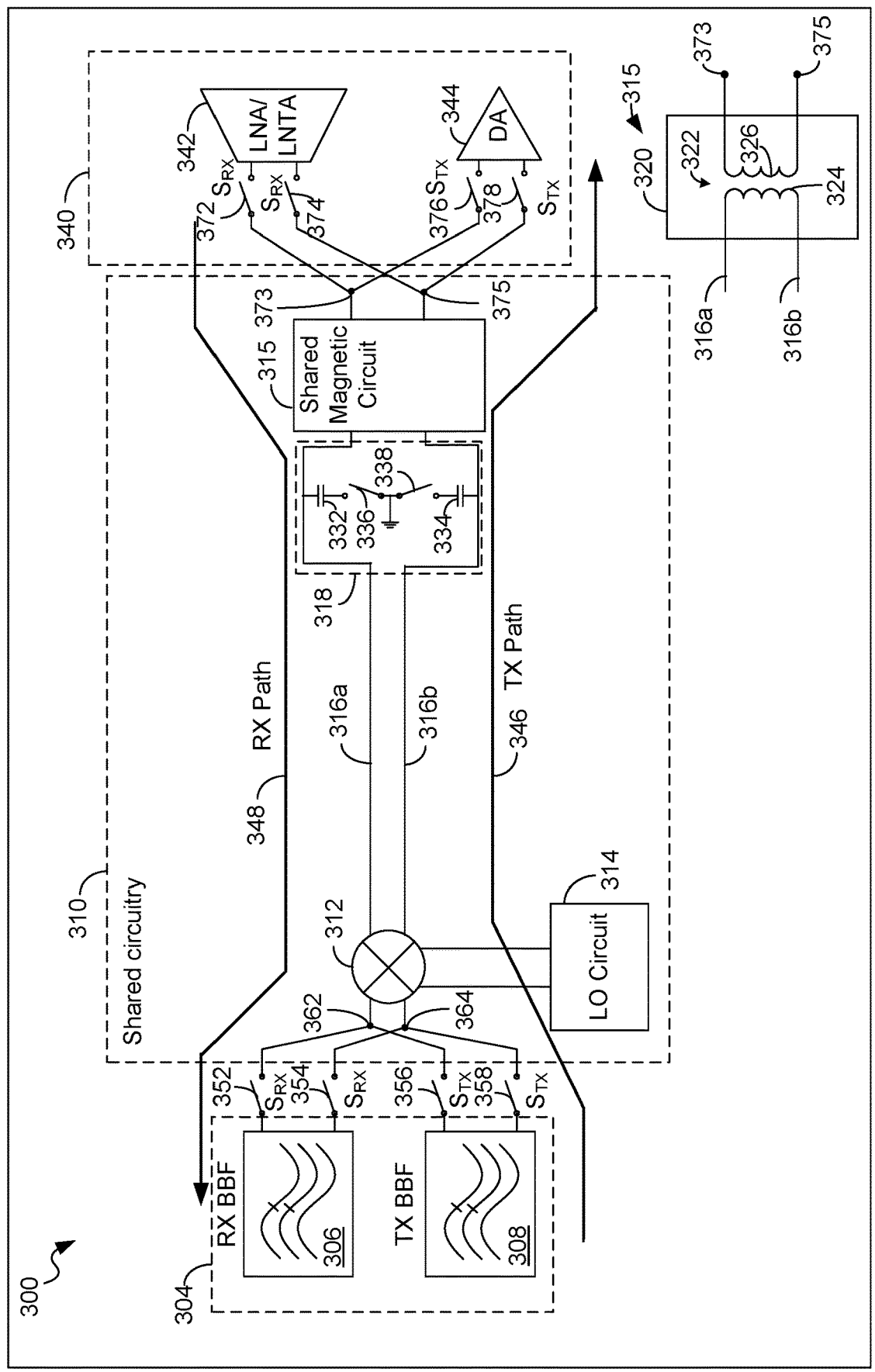
FIG. 3 is a block diagram of a portion of a transceiver in accordance with an exemplary embodiment of the disclosure.

FIG. 3 is a block diagram of a portion of a transceiver in accordance with an exemplary embodiment of the disclosure. In the exemplary embodiment shown in FIG. 3, the transceiver portion 300 is a direct-conversion (e.g., zero-IF or low IF) transceiver. In an exemplary embodiment, the transceiver portion 300 includes at least some of the elements described in FIG. 2. In contrast to FIG. 2, however, the transceiver portion 300 includes a signal path which is shared between transmit and receive functions instead of having a separate transmitter and receiver. Other examples described below similarly include a shared signal path (in contrast to FIG. 2).

In an exemplary embodiment, the transceiver portion 300 includes a baseband filter (BBF) circuit 304, a passive mixer 312, a local oscillator (LO) circuit 314, a receive compensation circuit 318, a shared magnetic circuit 315, and a front end circuit 340 having a low noise amplifier (LNA) 342 and a driver amplifier 344. As used herein, the terms "magnetic circuit" and "shared magnetic circuit" refer to a circuit that may comprise one or more of inductive, capacitive and/or resistive elements that may provide impedance matching. In some embodiments, all of the components of the transceiver portion 300 are implemented on the same die.

In an exemplary embodiment, the LNA 342 may also be implemented as a low noise transconductance amplifier (LNTA), and may also be referred to as a gm cell. In an exemplary embodiment, the low noise amplifier (LNA) 342 and the driver amplifier 344 may be implemented together in a radio frequency (RF) front end module, or may be implemented in separate modules or as separate components coupled to a circuit board. In some embodiments, a power amplifier, such as the power amplifier 244 of FIG. 2, may be used in addition to or instead of the driver amplifier 344. In other embodiments, another amplifier besides a DA or PA may be used instead of the driver amplifier 344. For example, a discrete amplifier that couples to the PA 244 or to the antenna 248 may be used. In some embodiments, the duplexer of switch 246 of FIG. 2 is omitted in transmit and receive paths which are configured as illustrated with respect to the transceiver portion 300. For example, the both the LNA 342 and the DA 344 may be (directly) coupled to the antenna 248.

In an exemplary embodiment, the passive mixer 312, the local oscillator (LO) circuit 314, the receive compensation circuit 318, and the shared magnetic circuit 315 may comprise shared circuitry 310. As used herein, the terms "shared circuitry" and "shared circuit" refer to one or more circuits and/or circuit elements that may be shared by a transmit path 346 and by a receive path 348. Sharing circuit elements, such as the passive mixer 312, the local oscillator (LO) circuit 314, and the shared magnetic circuit 315, between the transmit path 346 and the receive path 348 may significantly reduce the amount of area consumed on a circuit board by these components, reduce power consumption, facilitates overall circuit size reduction, and/or lower the cost of producing the circuit.

In an exemplary embodiment, the BBF circuit 304 may comprise a receive (RX) BBF circuit 306 and a transmit (TX) BBF circuit 308. The RX BBF circuit 306 may be an example of the lowpass filters 264a and 264b and/or the amplifiers 262a and 262b of FIG. 2. The TX BBF circuit 308 may be an example of the lowpass filters 232a and 232b and/or amplifiers 234a and 234b of FIG. 2. In an exemplary embodiment, the BBF filter circuit 304 may comprise all or part of a low pass filter circuit, such as baseband filters 232a, 232b, 264a and 264b and/or an amplifier circuit, such as amplifiers 234a, 234b, 262a and 262b.

In an exemplary embodiment, the passive mixer 312 is a device that exhibits a non-linear (e.g. exponential) characteristic. A passive mixer may use one or more diodes or other elements and rely on the element's non-linear relationship between voltage and current, to provide a multiplying function. In an exemplary embodiment, the passive mixer 312 may be configured as a voltage mixer configured to operate on a voltage input signal and provide a voltage output signal. In other exemplary embodiments, the passive mixer 312 may be configured as a current mixer configured to operate on a current input signal and provide a current output signal.

In an exemplary embodiment, the passive mixer 312 may be an example of the upconverter 240 and the downconverter 260 of FIG. 2. In an exemplary embodiment, the LO circuit 314 may be an example of the LO generator circuits 280, 290 of FIG. 2.

In an exemplary embodiment, the RX BBF 306 may be coupled to the passive mixer 312 by switches ($S_{RX}$) 352 and 354. Similarly, the TX BBF 308 may be coupled to the passive mixer 312 by switches ($S_{TX}$) 356 and 358.

In an exemplary embodiment, the switch 352 may couple the RX BBF 306 to the node 362 and the switch 356 may couple the TX BBF 308 to the node 362. In an exemplary embodiment, the switch 354 may couple the RX BBF 306 to the node 364 and the switch 358 may couple the TX BBF 308 to the node 364.

In an exemplary embodiment, the TX BBF 308 processes transmit signals that may be provided by the DAC 214a and the DAC 214b of FIG. 2. In an exemplary embodiment, the signals provided by the DAC 214a and the DAC 214b to the TX BBF 308 may be differential or single-ended. In the embodiment illustrated in FIG. 3 the signals shown may be differential signals or representative of single-ended I and Q signals.

In an exemplary embodiment, the RX BBF 306 processes receive signals that may be provided by the passive mixer 312. In an exemplary embodiment, the signals provided by the passive mixer 312 to the RX BBF 306 may be differential or single-ended. In the embodiment illustrated in FIG. 3, the signals shown may be differential signals or representative of single-ended I and Q signals.

The passive mixer 312 may be coupled to a receive compensation circuit 318 and to the shared magnetic circuit 315 over differential communication lines 316a and 316b. In an exemplary embodiment, the receive compensation circuit 318 may comprise capacitors 332 and 334, and switches 336 and 338. In an exemplary embodiment, the switches 336 and 338 may be selectively controlled by a signal from the data processor 210 (FIG. 2), or by another controller, to selectively couple the capacitors 332 and 334 between the differential communication lines 316a and 316b, respectively, and system ground. The capacitors 332, 334 need not be selectively coupled to a common node; for example, the capacitors 332, 334 may be separately selectively coupled to ground.

In an exemplary embodiment, the shared magnetic circuit 315 may be implemented in a variety of ways, and in the inset in FIG. 3 is illustrated in an exemplary embodiment as a shared magnetic circuit 320 having a transformer 322. The transformer 322 may include a first side 324 and a second side 326. In an exemplary embodiment, the first side 324 of the transformer 322 may be coupled to the passive mixer 312 over differential signal lines 316a and 316b.

In an exemplary embodiment, the second side 326 of the transformer 322 may be coupled to the nodes 373 and 375, which may be coupled to the LNA/LNTA 342 by switches ($S_{RX}$) 372 and 374, respectively. Similarly, the nodes 373 and 375 may be coupled to the DA 344 by switches ($S_{TX}$) 376 and 378, respectively.

In an exemplary embodiment, the switch 372 may couple the LNA/LNTA 342 to the node 373 and the switch 374 may couple the LNA/LNTA 342 to the node 375. In an exemplary embodiment, the switch 376 may couple the DA 344 to the node 373 and the switch 378 may couple the DA 344 to the node 375.

In an exemplary embodiment, the switches 352, 354, 356 and 358, and the switches 372, 374, 376 and 378 may be controlled by a signal from the data processor 210 (FIG. 2), or by another controller.

In an exemplary embodiment, in the transmit direction, the passive mixer 312 may be configured to convert the communication signal on nodes 362 and 364 between a baseband signal and a radio frequency (RF) signal determined by the frequency of the signals provided to the passive mixer 312 by the LO circuit 314. The RF signal on differential communication lines 316a and 316b is then provided to the shared magnetic circuit 315. In an exemplary embodiment, the shared magnetic circuit 315 can be configured to operate as a transmit signal amplification circuit to provide a step-up function to either a voltage-mode signal or a current-mode signal in a transmit mode. In an exemplary embodiment where the shared magnetic circuit 315 may be configured to operate on a current mode transmit signal, the current mode signal may be converted to a voltage mode signal by the DA 344.

In an exemplary embodiment, in the receive direction, a receive signal is provided from the LNA/LNTA 342 to the shared magnetic circuit 315 at nodes 373 and 375. In the receive direction, the shared magnetic circuit 315 can be configured to operate as a receive signal amplification circuit to provide a step-up function to either a voltage-mode signal or a current-mode signal in a receive mode. In an exemplary embodiment where the shared magnetic circuit 315 is configured to provide a step-up function to a current-mode receive signal, the shared magnetic circuit 315 behaves as a current step-up circuit or in some embodiments as a current maintenance circuit, and provides the receive signal to the receive compensation circuit 318 and then to the passive mixer 312 over differential communication lines 316a and 316b. The passive mixer 312 downconverts the RF signal on differential communication lines 316a and 316b to a baseband (or near baseband) signal, the frequency of which is determined by the frequency of the signal provided by the LO circuit 314. The baseband signal is then provided to the BBF circuit 304 for further processing.

In an exemplary embodiment, when the transceiver portion 300 is in transmit mode, the switches 356, 358, 376 and 378 may be controlled to be conductive, while the switches 352, 354, 372 and 374 may be controlled to be nonconductive, and a transmit signal is communicated from the TX BBF 308 to the mixer 312, upconverted by the mixer 312 and provided to driver amplifier 344 through the shared magnetic circuit 315.

In an exemplary embodiment, the switches 356, 358, 376 and 378 may be controlled to be conductive (and the switches 352, 354, 372 and 374 may be controlled to be nonconductive), when the transceiver portion 300 is in transmit mode and a voltage-mode signal is traversing the transmit path 346. In the example where the transceiver portion 300 is in transmit mode and a voltage-mode signal is traversing the transmit path 346, the shared magnetic circuit 315 behaves as a voltage step-up transformer, providing a voltage signal to the driver amplifier 344.

In an exemplary embodiment, when the transceiver portion 300 is in receive mode, the switches 352, 354, 372 and 374 may be controlled to be conductive, while the switches 356, 358, 376 and 378 may be controlled to be nonconductive, and a receive signal is communicated from the LNA/LNTA 342 to the mixer 312 through the shared magnetic circuit 315 and the receive compensation circuit 318. The mixer 312 downconverts the receive signal and passes the downconverted signal to the RX BBF 306.

In an exemplary embodiment, the switches 352, 354, 372 and 374 may be controlled to be conductive (and the switches 356, 358, 376 and 378 may be controlled to be nonconductive), when the transceiver portion 300 is in receive mode and a current-mode signal is traversing the receive path 348. In the example where the transceiver portion 300 is in receive mode and a current-mode signal is traversing the receive path 348, the shared magnetic circuit 315 behaves as a current step-up circuit, or current maintenance circuit, providing a current signal to the passive mixer 312. For example, 342 may be implemented as an LNTA configured to output a current signal, and may drive current into the mixer 312 to maintain gain. As can be inferred by the examples provided above, in some embodiments the transmit mode operates as a voltage mode with the mixer 312 operating as a step-up transformer to provide a voltage signal to the DA 344, and the receive mode operates as a current mode with the mixer 312 receiving a current signal from the LNTA 342.

In the example illustrated in FIG. 3, in receive mode, the switches 336 and 338 in the receive compensation circuit 318 are also controlled to be conductive, selectively coupling the capacitances 332 and 334 between the differential signal lines 316a and 316b, respectively, and system ground. In receive mode, the capacitances 332 and 334 resonate with the inductance of the first side 324 of the transformer 322 so that the transformer 322 behaves like a current source. The capacitance value of the capacitance 332 and the capacitance 334 depends on the inductance value of the first side 324 of the transformer 322. In an exemplary embodiment, if the inductance of the first side 324 of the transformer 322 is sufficiently large, then the transformer 322 alone can operate in the receive direction as a current source. In some embodiments, an additional input match circuit (not illustrated) is implemented in the transmit path 346 between the shared magnetic circuit 315 and the DA 344. In some embodiments, the RF signals have a frequency between 2-3 GHz, for example in a band around 2.4 GHz. In some embodiments, the RF signals have a frequency between 3-5 GHz, for example in a band around 3.5 GHz. In some embodiments, the RF signals have a frequency that is lower than approximately 7 GHz, for example in a band between approximately 5-7 GHz.

Figure 4:
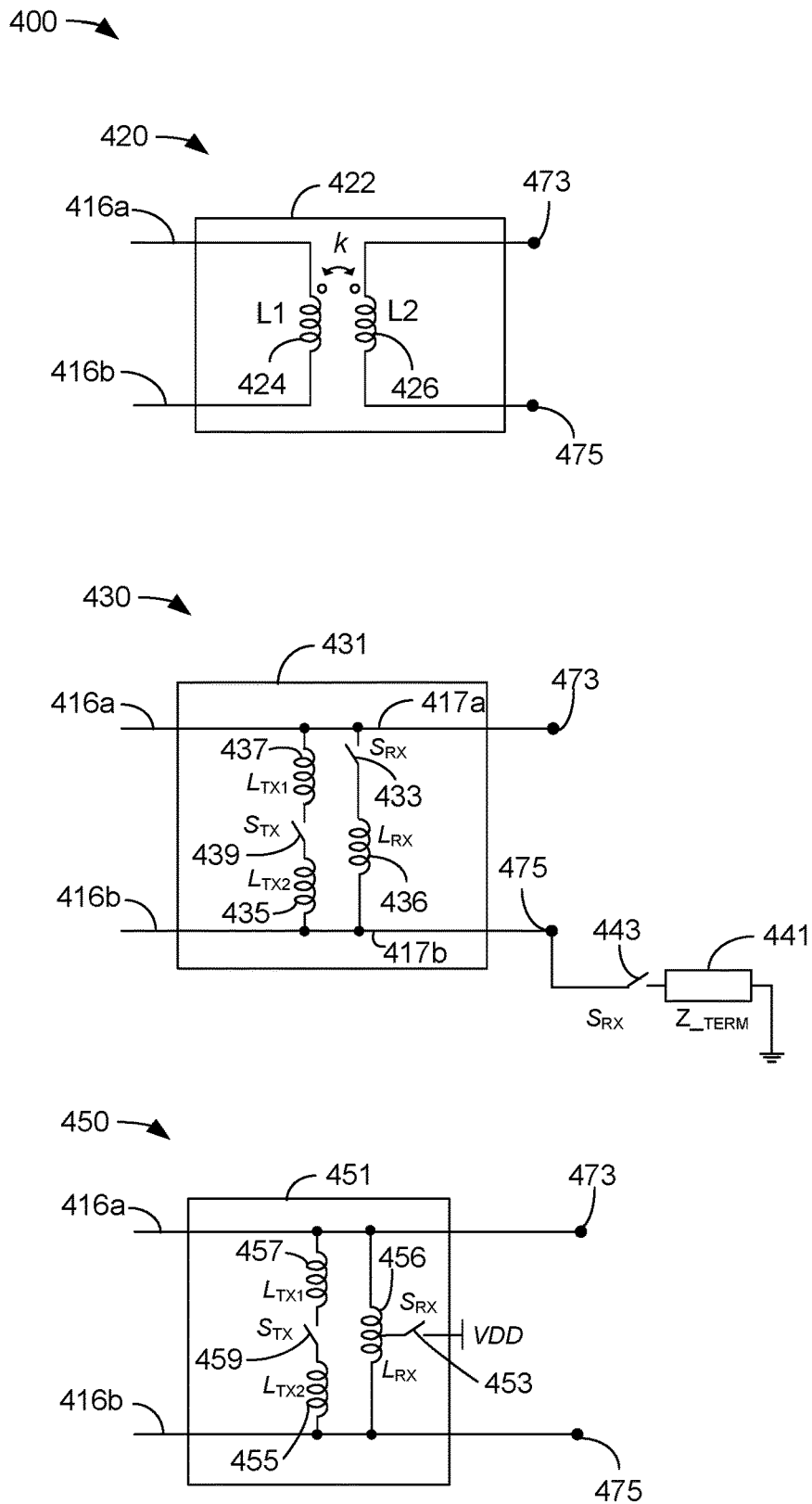
FIG. 4 is a schematic diagram illustrating exemplary embodiments of a shared magnetic circuit of FIG. 3.

FIG. 4 is a schematic diagram illustrating exemplary embodiments of a shared magnetic circuit of FIG. 3. A first exemplary embodiment of a shared magnetic circuit 420 may be implemented in a communication system having a differential transmit path and a differential receive path, and may be similar to the shared magnetic circuit 320 of FIG. 3. In an exemplary embodiment, the shared magnetic circuit 420 may comprise a transformer 422. The transformer 422 may include a first side 424 having an inductance, L1, and a second side 426 having an inductance, L2. In an exemplary embodiment, the first side 424 may be coupled to differential communication lines 416a and 416b, which are similar to the differential communication lines 316a and 316b of FIG. 3. In an exemplary embodiment, the second side 426 may be coupled to the nodes 473 and 475, which are similar to the nodes 373 and 375 of FIG. 3.

A coupling factor "k" exists between the first side 424 (L1) and the second side 426 (L2), where the value of "k" is determined by a number of factors including, for example, the inductance values for L1 and L2, the number of windings in each of the first side 424 and the second side 426, the layout of the inductances that form the first side 424 and the second side 426, and other factors. In an exemplary embodiment, the value of "k" determines the transfer function of the transformer 422 for both transmit signals and for receive signals. In an exemplary embodiment, the value of "k" influences the voltage across the first side 424 and the second side 426 of the transformer 422 in a transmit mode, and influences the current through the first side 424 and the second side 426 of the transformer 422 in receive mode. In an exemplary embodiment, a higher value for "k" would be beneficial where the transmit mode operates in voltage mode and the receive mode operates in current mode. In an exemplary embodiment, a value of "k" approaching one (1) may be beneficial in such an implementation. In some such embodiments, a higher coupling factor results in increased performance.

A second exemplary embodiment of a shared magnetic circuit 430 may be implemented in a communication system having a differential transmit path and a single-ended receive path (as will be described in more detail below). Some of the elements in the shared magnetic circuit 430 are identical to elements in the shared magnetic circuit 420 and are identically numbered. In an exemplary embodiment, the shared magnetic circuit may comprise circuitry 431 having an inductance 437 ($L_{TX1}$) coupled to a first differential communication line 416a and an inductance 435 ($L_{TX2}$) coupled to a second differential communication line 416b. The inductances 437 and 435 may also be coupled to a switch 439 ($S_{TX}$) The circuitry 431 may also comprise an inductance 436 ($L_{RX}$) selectively coupled through a switch 433 (SRX) to a first communication line 417a and to the node 473. The inductance 436 may also be coupled to a second communication line 417b and to the node 475.

In an exemplary embodiment, the inductor 437 and the inductor 435 may be implemented as overlapping inductors to minimize the amount of area used on the circuit chip on which the circuitry 431 is fabricated. Similarly, the inductor 436 may also be formed as an overlapping inductor with one or both of the inductors 437 and 435. As used herein, the terms "overlapping" and "overlapping inductor" refer to using the same physical chip area for multiple inductances. For example, one way of implementing overlapping inductors is to use a higher metal layer for one inductor and a lower metal layer for the other inductor, or to interleave layers of the inductors. Another way of implementing overlapping inductors is placing two inductors on the same metal layer where one inductor uses an outer metal layer portion and the other inductor uses an inner metal layer portion.

In an exemplary embodiment, the first communication line 417a and the second communication line 417b may be configured to carry either differential signals or a single-ended signal, as described below.

Figure 8:
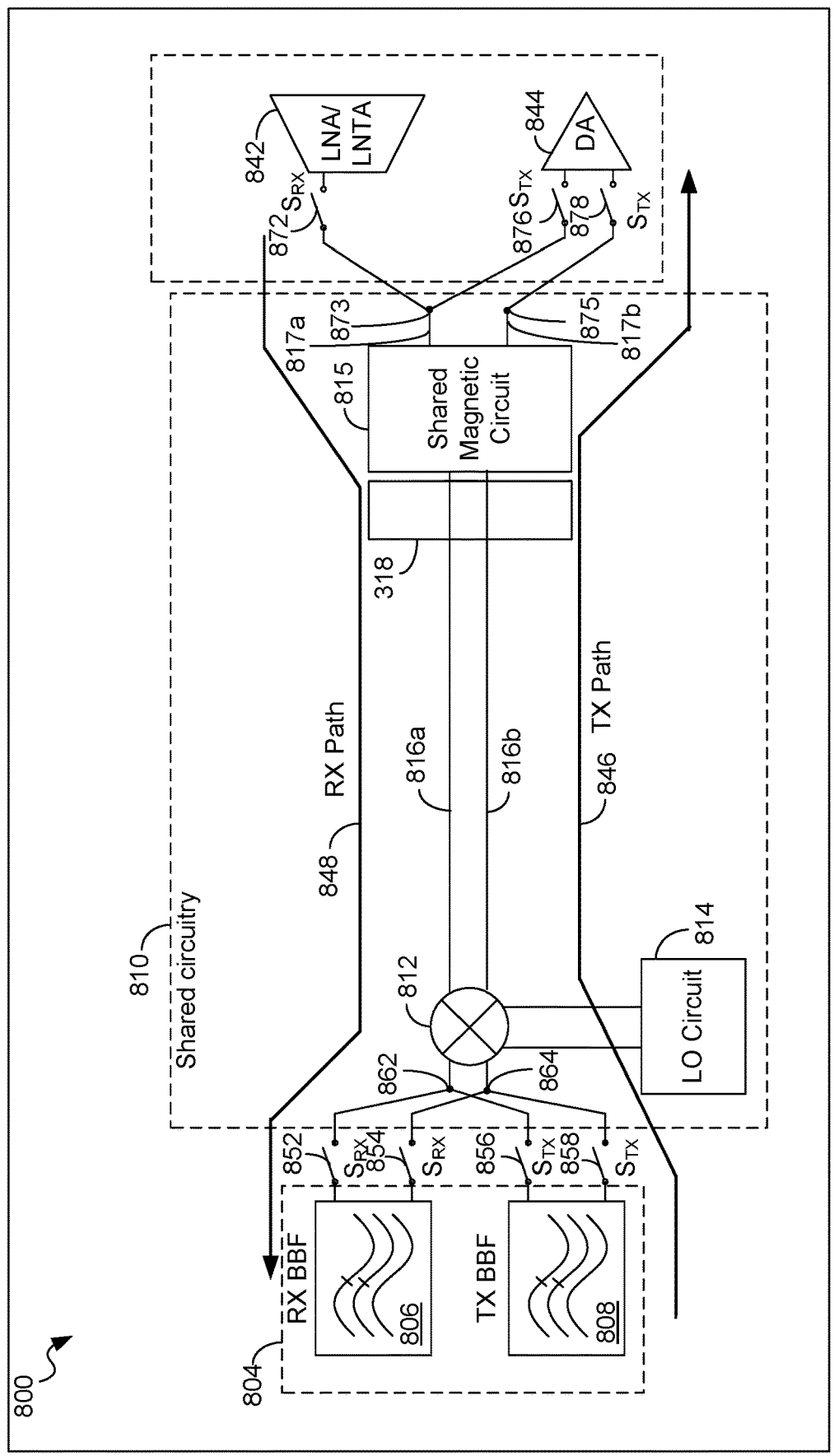
FIG. 8 is a block diagram of a portion of a transceiver in accordance with an exemplary embodiment of the disclosure.

In an exemplary embodiment, in a transmit mode, the switch 439 is conductive (closed) and the switch 433 is non-conductive (open). In an exemplary embodiment, in a receive mode, the switch 439 is non-conductive (open) and the switch 433 is conductive (closed). In an exemplary embodiment where a differential transmit signal is provided to the connections 473 and 475 (as is illustrated in FIG. 3, for example), the switch 443 ($S_{RX}$) is made to be non-conductive so as to disconnect the connection 475 from ground. In an exemplary embodiment where a single-ended receive signal is provided to the connection 473 (as is illustrated in FIG. 8, for example, and discussed below), the connection 475 is connected to a termination impedance 441 by making the switch 443 ($S_{RX}$) conductive when in the receive mode. In an exemplary embodiment, the termination impedance 441 coupling the node 475 to ground allows a single-ended receive signal on connection 473 to be converted to differential signals on connections 416a and 416b. For example, the termination impedance 441 may comprise a load matched to the load on connection 473 and/or 416. In an exemplary embodiment, the switches 433, 439 and 443 may be controlled by a signal from the data processor 210 (FIG. 2), or by another controller.

A third exemplary embodiment of a shared magnetic circuit 450 may be implemented in a communication system having a differential transmit path and a differential receive path. Some of the elements in the shared magnetic circuit 450 are identical to elements in the shared magnetic circuit 420 and are identically numbered. In an exemplary embodiment, the shared magnetic circuit 450 may comprise circuitry 451 having an inductance 457 ($L_{TX1}$) coupled to a first differential communication line 416a and an inductance 455 ($L_{TX2}$) coupled to a second differential communication line 416b. The inductances 457 and 455 may also be coupled to a switch 459 ($S_{TX}$) The circuitry 451 may also comprise an inductance 456 ($L_{RX}$) coupled to the first differential communication line 416a and to the node 473, and to the second differential communication line 416b and to the node 475. The inductance 456 ($L_{RX}$) may also be selectively coupled through a switch 453 ($S_{RX}$) to a system voltage, VDD.

In an exemplary embodiment, in a transmit mode, the switch 459 would be conductive (closed) and the switch 453 would be non-conductive (open). In an exemplary embodiment, in a receive mode, the switch 459 would be non-conductive (open) and the switch 453 would be conductive (closed). In an exemplary embodiment, the switches 453 and 459 may be controlled by a signal from the data processor 210 (FIG. 2), or by another controller.

Figure 5:
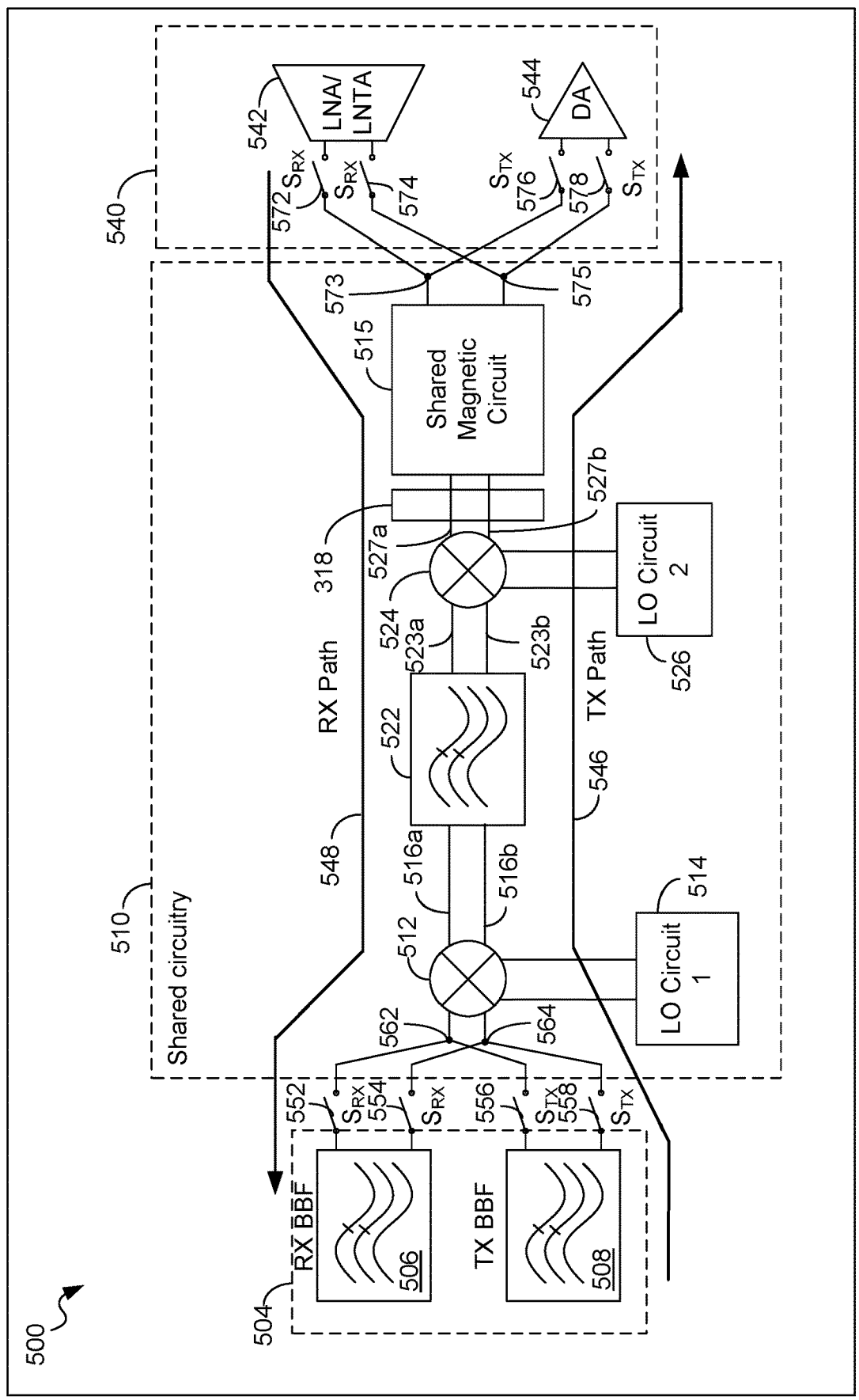
FIG. 5 is a block diagram of a portion of a transceiver in accordance with an exemplary embodiment of the disclosure.

FIG. 5 is a block diagram of a portion of a transceiver in accordance with an exemplary embodiment of the disclosure. In an exemplary embodiment, the transceiver portion 500 includes at least some of the elements described in FIG. 2 and FIG. 3. However, while the transceiver portion 300 of FIG. 3 illustrates an exemplary embodiment of a direct conversion transceiver (e.g., a zero-IF or low-IF transceiver), the transceiver portion 500 illustrated in FIG. 5 illustrates an exemplary embodiment of a super-heterodyne transceiver (also referred to as a superhet transceiver). A superhet transceiver uses an intermediate frequency signal (IF) between baseband and the RF frequency.

In an exemplary embodiment, the transceiver portion 500 includes a baseband filter (BBF) circuit 504, a first passive mixer 512, a first local oscillator (LO) circuit 514, an intermediate frequency (IF) filter 522, a second passive mixer 524, a second local oscillator (LO) circuit 526, the receive compensation circuit 318, a shared magnetic circuit 515, and a front end circuit 540 having a low noise amplifier (LNA) 542 and a driver amplifier 544.

In an exemplary embodiment, the LNA 542 may also be implemented as a low noise transconductance amplifier (LNTA), and may also be referred to as a gm cell. In an exemplary embodiment, the low noise amplifier (LNA) 542 and the driver amplifier 544 may be implemented together in a radio frequency (RF) front end module, or may be implemented in separate modules or as separate components, and can be similar to the RF front end circuit 340 of FIG. 3.

In an exemplary embodiment, the first passive mixer 512, the first local oscillator (LO) circuit 514, the IF filter 522, the second passive mixer 524, the second local oscillator (LO) circuit 526, the receive compensation circuit 318, and the shared magnetic circuit 515 may comprise shared circuitry 510. As used herein, the terms "shared circuitry" and "shared circuit" refer to circuits and circuit elements that may be shared by a transmit path 546 and by a receive path 548.

In an exemplary embodiment, the BBF circuit 504 may comprise a receive (RX) BBF circuit 506 and a transmit (TX) BBF circuit 508. The RX BBF circuit 504 may be an example of the lowpass filters 264a and 264b of FIG. 2. The TX BBF circuit 508 may be an example of the lowpass filters 232a and 232b of FIG. 2. In an exemplary embodiment, the BBF circuit 504 may comprise all or part of a bi-quadrature (BiQuad) filter. In the example shown in FIG. 5, the RX BBF 506 and the TX BBF 508 in the BBF circuit 504 are shown in a non-quadrature arrangement for simplicity, similar to the BBF circuit 304 of FIG. 3.

In an exemplary embodiment, the first passive mixer 512 and the second passive mixer 524 exhibit a non-linear (e.g. exponential) characteristic. A passive mixer may use one or more diodes or other elements and rely on the element's non-linear relationship between voltage and current, to provide a multiplying function.

In an exemplary embodiment, the first passive mixer 512, the IF filter 522 and the second passive mixer 524 may be an example of the upconverter 240 and the downconverter 260 of FIG. 2. In an exemplary embodiment, the first LO circuit 514 and the second LO circuit 526 may be an example of the LO generator circuits 280, 290 of FIG. 2.

In an exemplary embodiment, the RX BBF 506 may be coupled to the first passive mixer 512 by switches ($S_{RX}$) 552 and 554. Similarly, the TX BBF 508 may be coupled to the first passive mixer 512 by switches ($S_{TX}$) 556 and 558.

In an exemplary embodiment, the switch 552 may couple the RX BBF 506 to the node 562 and the switch 556 may couple the TX BBF 508 to the node 562. In an exemplary embodiment, the switch 554 may couple the RX BBF 506 to the node 564 and the switch 558 may couple the TX BBF 508 to the node 564. In an exemplary embodiment, the RX BBF 506 and the TX BBF 508 may be similar to the RX BBF 306 and the TX BBF 308, respectively, of FIG. 3.

The first passive mixer 512 may be coupled to the IF filter 522 over differential communication lines 516a and 516b. The IF filter 522 may be coupled to the second passive mixer 524 over differential communication lines 523a and 523b.

The second passive mixer 524 may be coupled to the receive compensation circuit 318 and to a shared magnetic circuit 515 over differential communication lines 527a and 527b.

In an exemplary embodiment, the shared magnetic circuit 515 may be implemented in a variety of ways, and in FIG. 5 may be implemented as described above in FIG. 3, or as shared magnetic circuit 450 in FIG. 4.

In an exemplary embodiment, the shared magnetic circuit 515 may be coupled to the LNA/LNTA 542 by switches ($S_{RX}$) 572 and 574. Similarly, the shared magnetic circuit 515 may be coupled to the DA 544 by switches ($S_{TX}$) 576 and 578.

In an exemplary embodiment, the switch 572 may couple the LNA/LNTA 542 to the node 573 and the switch 574 may couple the LNA/LNTA 542 to the node 575. In an exemplary embodiment, the switch 576 may couple the DA 544 to the node 573 and the switch 578 may couple the DA 544 to the node 575.

In an exemplary embodiment, the switches 552, 554, 556 and 558, and the switches 572, 574, 576 and 578 may be controlled by a signal from the data processor 210 (FIG. 2), or by another controller.

In an exemplary embodiment, in the transmit direction, the first passive mixer 512 may be configured to convert the communication signal on nodes 562 and 564 between a baseband signal and an intermediate frequency determined by the frequency of the signals provided to the first passive mixer 512 by the first LO circuit 514. This intermediate frequency signal on differential communication lines 516a and 516b is then filtered to remove unwanted products, and then provided over differential communication lines 523a and 523b. The IF signal on differential communication lines 523a and 523b is then provided to the second passive mixer 524, which may be configured to convert the intermediate frequency communication signal on differential communication lines 523a and 523b to a radio frequency (RF) signal having a frequency determined by the frequency of the signals provided by the second LO circuit 526. The transmit signal is provided to the shared magnetic circuit 515 over differential communication lines 527a and 527b. In an exemplary embodiment, in the transmit direction, the shared magnetic circuit 515 behaves as a voltage step-up element and provides a voltage mode signal to the DA 544.

In an exemplary embodiment, in the receive direction, a receive signal is provided from the LNA/LNTA 542 to the shared magnetic circuit 515 at nodes 573 and 575. In an exemplary embodiment, in the receive direction, the shared magnetic circuit 515 behaves as a current step-up circuit or a current maintenance circuit, and provides the receive signal to the receive compensation circuit 318, and to the second passive mixer 524 over differential communication lines 527a and 527b.

In this example, and referring back to FIG. 3, in receive mode, the switches 336 and 338 in the receive compensation circuit 318 are also controlled to be conductive, coupling the capacitances 332 and 334 to the differential signal lines 316a and 316b, respectively. In receive mode, the capacitances 332 and 334 resonate with the inductance of the first side 324 of the transformer 322 so that the transformer 322 behaves like a current source.

The second passive mixer 524 downconverts the signal on differential communication lines 527a and 527b from an RF signal to an intermediate frequency (IF) signal, the frequency of which is determined by the frequency of the signal provided by the second LO circuit 526. The IF signal from the second passive mixer 524 is provided over differential communication lines 523a and 523b to the IF filter 522, which removes unwanted products. The filtered receive signal is then provided to the first passive mixer 512 over differential communication lines 516a and 516b. The first passive mixer 512 downconverts the signal on differential communication lines 516a and 516b from an IF signal to a baseband (or near baseband) signal, the frequency of which is determined by the frequency of the signal provided by the first LO circuit 514. The baseband signal is then provided to the BBF circuit 504 for further processing.

In an exemplary embodiment, when the transceiver portion 500 is in transmit mode, the switches 556, 558, 576 and 578 may be controlled to be conductive, while the switches 552, 554, 572 and 574 may be controlled to be nonconductive, and a transmit signal is communicated from the TX BBF 508 to the first passive mixer 512, upconverted by the first passive mixer 512, filtered by the IF filter 522, upconverted to a radio frequency (RF) signal by the second passive mixer 524, and then provided to driver amplifier 544 through the shared magnetic circuit 515.

In an exemplary embodiment, the switches 556, 558, 576 and 578 may be controlled to be conductive (and the switches 552, 554, 572 and 574 may be controlled to be nonconductive) when the transceiver portion 500 is in transmit mode and a voltage-mode signal is traversing the transmit path 546. In the example where the transceiver portion 500 is in transmit mode and a voltage-mode signal is traversing the transmit path 546, the shared magnetic circuit 515 behaves as a voltage step-up circuit, providing a voltage signal to the driver amplifier 544.

In an exemplary embodiment, when the transceiver portion 500 is in receive mode, the switches 552, 554, 572 and 574 may be controlled to be conductive, while the switches 556, 558, 576 and 578 may be controlled to be nonconductive, and a receive signal is communicated from the LNA/LNTA 542, through the shared magnetic circuit 515 and the receive compensation circuit 318 to the second passive mixer 524, the IF filter circuit 522 and to the first passive mixer 512. The first passive mixer 512 downconverts the receive signal and passes the downconverted signal to the RX BBF 506.

In an exemplary embodiment, the switches 552, 554, 572 and 574 may be controlled to be conductive (and the switches 556, 558, 576 and 578 may be controlled to be nonconductive) when the transceiver portion 500 is in receive mode and a current-mode signal is traversing the receive path 548. In the example where the transceiver portion 500 is in receive mode and a current-mode signal is traversing the receive path 548, the shared magnetic circuit 515 behaves as a current step-up circuit, or current maintenance circuit, providing a current signal to the first passive mixer 512. In some embodiments, the RF signals have a millimeter wave (mmW) frequency, for example greater than approximately 24 GHz.

Figure 6:
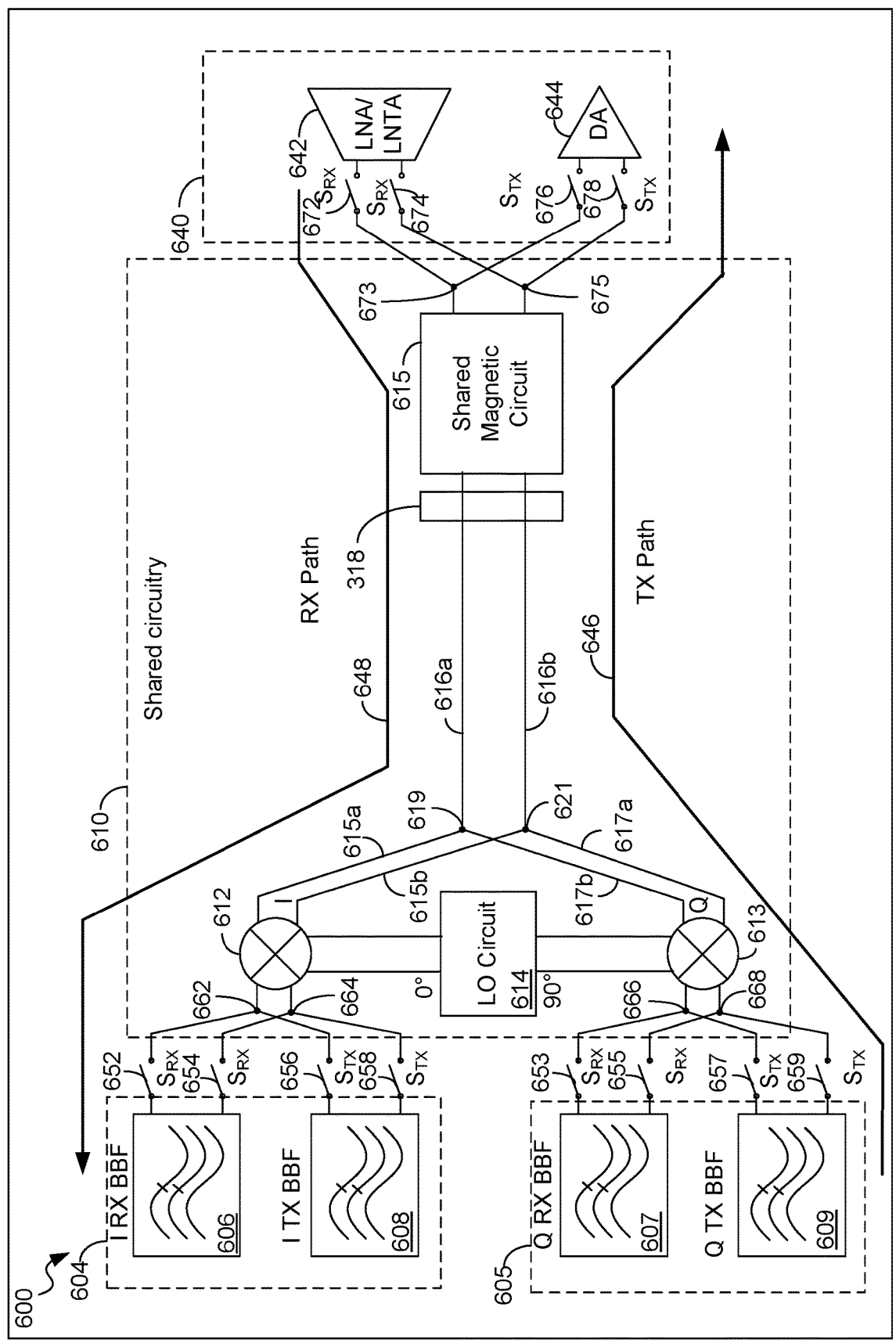
FIG. 6 is a block diagram of a portion of a transceiver in accordance with an exemplary embodiment of the disclosure.

FIG. 6 is a block diagram of a portion of a transceiver in accordance with an exemplary embodiment of the disclosure. In the exemplary embodiment shown in FIG. 6, the transceiver portion 600 is a direct-conversion single sideband (SSB) transceiver configured to process both in-phase (I) and quadrature (Q) signals. In the exemplary embodiment shown in FIG. 6, the transceiver portion 600 may also be referred to as a direct conversion transceiver. In an exemplary embodiment, the transceiver portion 600 includes at least some of the elements described in FIG. 2 and FIG. 3.

In an exemplary embodiment, the transceiver portion 600 includes an in-phase (I) baseband filter (BBF) circuit 604, a quadrature (Q) BBF filter circuit 605, an in-phase (I) passive mixer 612, a quadrature (Q) passive mixer 613, a local oscillator (LO) circuit 614, the receive compensation circuit 318, a shared magnetic circuit 615, and a front end circuit 640 having a low noise amplifier (LNA) 642 and a driver amplifier 644. In an exemplary embodiment, the LNA 642 may also be implemented as a low noise transconductance amplifier (LNTA), and may also be referred to as a gm cell. In an exemplary embodiment, the low noise amplifier (LNA) 642 and the driver amplifier 644 may be implemented together in a radio frequency (RF) front end module and/or on a common die, or may be implemented separately.

In an exemplary embodiment, the I passive mixer 612, the Q passive mixer 613, the local oscillator (LO) circuit 614, the receive compensation circuit 318, and the shared magnetic circuit 615 may comprise shared circuitry 610. As used herein, the terms "shared circuitry" and "shared circuit" refer to circuits and circuit elements that may be shared by a transmit path 646 and by a receive path 648.

In an exemplary embodiment, the I BBF circuit 604 may comprise an in-phase (I) receive (RX) BBF circuit 606 and an in-phase (I) transmit (TX) BBF circuit 608. In an exemplary embodiment, the Q BBF circuit 605 may comprise a (Q) receive (RX) BBF circuit 607 and a (Q) transmit (TX) BBF circuit 609. The I RX BBF circuit 606 and the Q RX BBF circuit 607 may be an example of the lowpass filters 264a and 264b of FIG. 2. The I TX BBF circuit 608 and the Q TX BBF circuit 609 may be an example of the lowpass filters 232a and 232b of FIG. 2. In an exemplary embodiment, the I BBF circuit 604 and the Q BBF circuit 609 may comprise all or part of a bi-quadrature (BiQuad) filter. One or both of the circuits 606, 607 may be configured similar to or an example of the circuit 306. One or both of the circuits 608, 609 may be configured similar to or an example of the circuit 308.

In an exemplary embodiment, the I passive mixer 612 and the Q passive mixer 613 exhibit a non-linear (e.g. exponential) characteristic. A passive mixer may use one or more diodes or other elements and rely on the element's non-linear relationship between voltage and current, to provide a multiplying function.

In an exemplary embodiment, the I passive mixer 612 and the Q passive mixer 613 may be examples of the upconverter 240 and the downconverter 260 of FIG. 2. In an exemplary embodiment, the LO circuit 614 may be an example of the LO generator circuit 295 of FIG. 2.

In an exemplary embodiment, the I RX BBF 606 may be coupled to the I passive mixer 612 by switches ($S_{RX}$) 652 and 654. Similarly, the I TX BBF 608 may be coupled to the I passive mixer 612 by switches ($S_{TX}$) 656 and 658.

In an exemplary embodiment, the Q RX BBF 607 may be coupled to the Q passive mixer 613 by switches ($S_{RX}$) 653 and 655. Similarly, the Q TX BBF 609 may be coupled to the Q passive mixer 613 by switches ($S_{TX}$) 657 and 659.

In an exemplary embodiment, the switch 652 may couple the I RX BBF 606 to the node 662 and the switch 656 may couple the I TX BBF 608 to the node 662. In an exemplary embodiment, the switch 654 may couple the I RX BBF 606 to the node 664 and the switch 658 may couple the I TX BBF 608 to the node 664.

In an exemplary embodiment, the switch 653 may couple the Q RX BBF 607 to the node 666 and the switch 657 may couple the Q TX BBF 609 to the node 666. In an exemplary embodiment, the switch 655 may couple the Q RX BBF 607 to the node 668 and the switch 659 may couple the Q TX BBF 609 to the node 668.

The I passive mixer 612 may be coupled to a node 619 over differential communication line 615a and may be coupled to a node 621 over differential communication line 615b. The Q passive mixer 613 may be coupled to the node 621 over differential communication line 617a and may be coupled to the node 619 over differential communication line 617b. The nodes 619 and 621 may also be coupled to the receive compensation circuit 318 and to the shared magnetic circuit 615 over differential communication lines 616a and 616b.

In an exemplary embodiment, the shared magnetic circuit 615 may be implemented in a variety of ways, such as shared magnetic circuit 420 or shared magnetic circuit 450 as shown in FIG. 4.

In an exemplary embodiment, the shared magnetic circuit 615 may be coupled to the LNA/LNTA 642 by switches ($S_{RX}$) 672 and 674. Similarly, the shared magnetic circuit 615 may be coupled to the DA 644 by switches ($S_{TX}$) 676 and 678.

In an exemplary embodiment, the switch 672 may couple the LNA/LNTA 642 to the node 673 and the switch 674 may couple the LNA/LNTA 642 to the node 675. In an exemplary embodiment, the switch 676 may couple the DA 644 to the node 673 and the switch 678 may couple the DA 644 to the node 675.

In an exemplary embodiment, the switches 652, 654, 656 and 658, the switches 653, 655, 657 and 659; and the switches 672, 674, 676 and 678 may be controlled by a signal from the data processor 210 (FIG. 2), or by another controller.

In an exemplary embodiment, in the transmit direction, the I passive mixer 612 and the Q passive mixer 613 may be configured to convert the communication signal on nodes 662 and 664, and nodes 666 and 668 between a baseband signal and a radio frequency (RF) signal determined by the frequency of the signals provided to the I passive mixer 612 and the Q passive mixer 613 by the LO circuit 614. In an exemplary embodiment, the LO circuit 614 provides in-phase (I) LO signals to the I passive mixer 612 and provides quadrature (Q) LO signals to the q passive mixer 613. In an exemplary embodiment, the I LO signals may be offset by 90 degrees from the Q LO signals; however, other degrees of offset are possible. The RF signal on nodes 619 and 621 is then provided to the shared magnetic circuit 615 over differential communication lines 616a and 616b.

In an exemplary embodiment, in the receive direction, a receive signal is provided from the LNA/LNTA 642 to the shared magnetic circuit 615 at nodes 673 and 675. In the receive direction, the shared magnetic circuit 615 behaves as a current step-up circuit or a current maintenance circuit, and provides the receive signal to the receive compensation circuit 318 and then to the passive mixer 614 over differential communication lines 616a and 616b.

In this example, and referring back to FIG. 3, in receive mode, the switches 336 and 338 in the receive compensation circuit 318 are also controlled to be conductive, coupling the capacitances 332 and 334 to the differential signal lines 316a and 316b, respectively. In receive mode, the capacitances 332 and 334 resonate with the inductance of the first side 324 of the transformer 322 so that the transformer 322 behaves like a current source.

The receive signal is then provided to the I passive mixer 612 and the Q passive mixer 613 over differential communication lines 616a and 616b. The I passive mixer 612 and the Q passive mixer 613 downconverts the RF signal on differential communication lines 616a and 616b to a baseband (or near baseband) signal, the frequency of which is determined by the frequency of the signal provided by the LO circuit 614. The baseband signal is then provided to the BBF circuit 604 and the BBF circuit 605 for further processing.

In an exemplary embodiment, when the transceiver portion 600 is in transmit mode, the switches 656, 658, 657, 659, 676 and 678 may be controlled to be conductive, while the switches 652, 654, 653, 655, 672 and 674 may be controlled to be nonconductive, and a transmit signal is communicated from the I TX BBF 608 and the Q TX BBF 609 to the I mixer 612 and Q mixer 613, upconverted by the I passive mixer 612 and the Q passive mixer 613, and provided to driver amplifier 644 through the shared magnetic circuit 615.

In an exemplary embodiment, the switches 656, 658, 657, 659, 676 and 678 may be controlled to be conductive (and the switches 652, 654, 653, 655, 672 and 674 may be controlled to be nonconductive), when the transceiver portion 600 is in transmit mode and a voltage-mode signal is traversing the transmit path 646. In the example where the transceiver portion 600 is in transmit mode and a voltage-mode signal is traversing the transmit path 646, the shared magnetic circuit 615 behaves as a voltage step-up circuit, providing a voltage signal to the driver amplifier 644.

In an exemplary embodiment, when the transceiver portion 600 is in receive mode, the switches 652, 654, 653, 655, 672 and 674 may be controlled to be conductive, while the switches 656, 656, 657, 659, 676 and 678 may be controlled to be nonconductive, and a receive signal is communicated from the LNA/LNTA 642 to the I passive mixer 612 and the Q passive mixer 613 through the receive compensation circuit 318 and the shared magnetic circuit 615. The I passive mixer 612 and the Q passive mixer 613 downconverts the receive signal and passes the downconverted signal to the I RX BBF 606 and the Q RX BBF 607.

In an exemplary embodiment, the switches 652, 654, 653, 655, 672 and 674 may be controlled to be conductive (and the switches 656, 658, 657, 659, 676 and 678 may be controlled to be nonconductive), when the transceiver portion 600 is in receive mode and a current-mode signal is traversing the receive path 648. In the example where the transceiver portion 600 is in receive mode and a current-mode signal is traversing the receive path 648, the shared magnetic circuit 615 behaves as a current step-up circuit, or current maintenance circuit, providing a current signal to the I passive mixer 612 and the Q passive mixer 613.

Figure 7:
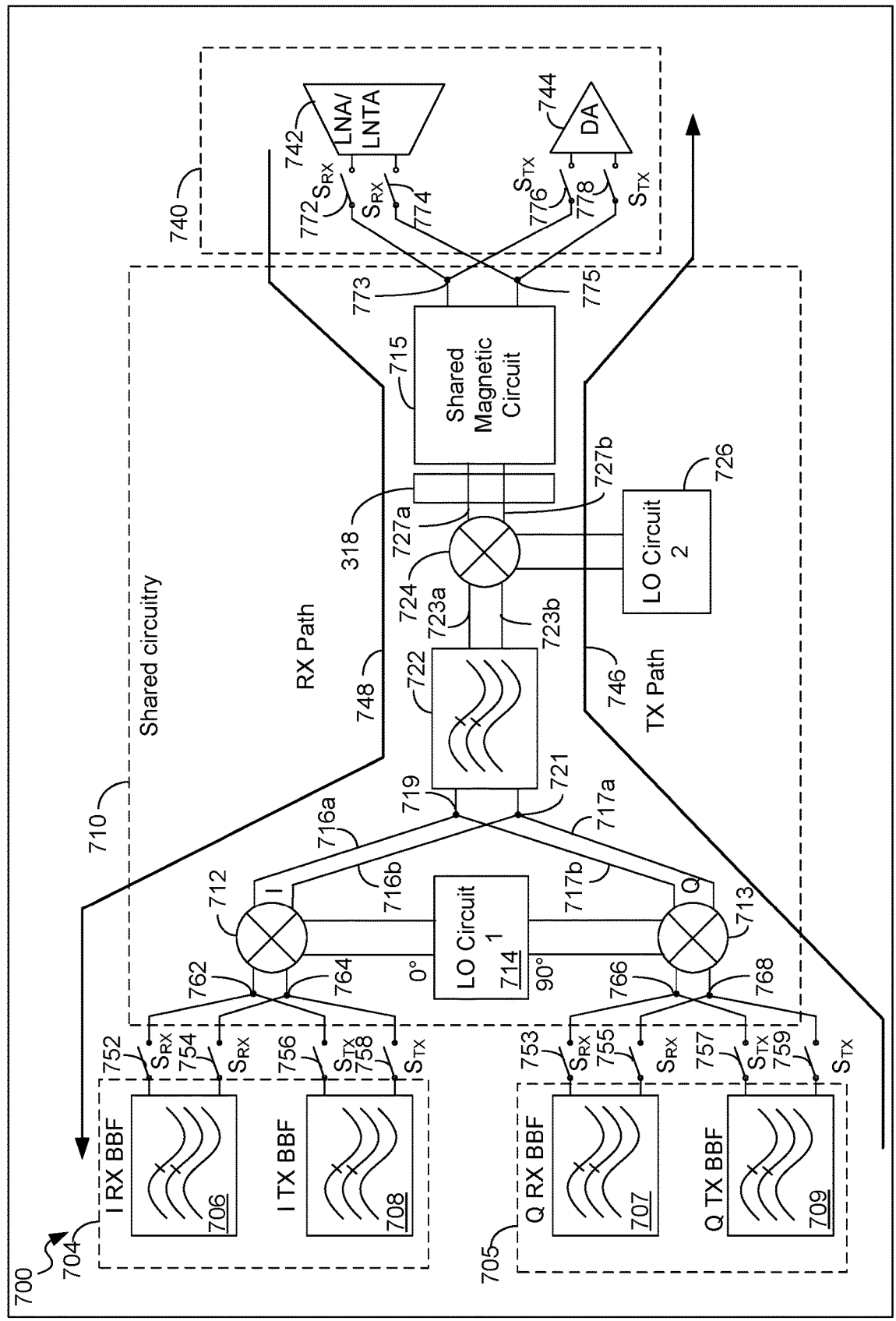
FIG. 7 is a block diagram of a portion of a transceiver in accordance with an exemplary embodiment of the disclosure.

FIG. 7 is a block diagram of a portion of a transceiver in accordance with an exemplary embodiment of the disclosure. In the exemplary embodiment shown in FIG. 7, the transceiver portion 700 is a superhet single sideband (SSB) transceiver configured to process both in-phase (I) and quadrature (Q) signals. In an exemplary embodiment, the transceiver portion 700 includes at least some of the elements described in FIG. 2 and FIG. 5.

In an exemplary embodiment, the transceiver portion 700 includes an in-phase (I) baseband filter (BBF) circuit 704, a quadrature (Q) BBF filter circuit 705, an in-phase (I) passive mixer 712, a quadrature (Q) passive mixer 713, a first local oscillator (LO) circuit 714, an intermediate frequency (IF) filter 722, a second passive mixer 724, a second local oscillator (LO) circuit 726, the receive compensation circuit 318, a shared magnetic circuit 715, and a front end circuit 740 having a low noise amplifier (LNA) 742 and a driver amplifier 744. In an exemplary embodiment, the LNA 742 may also be implemented as a low noise transconductance amplifier (LNTA), and may also be referred to as a gm cell. In an exemplary embodiment, the low noise amplifier (LNA) 742 and the driver amplifier 744 may be implemented together in a radio frequency (RF) front end module and/or on the same die, or may be implemented separately.

In an exemplary embodiment, the I passive mixer 712, the Q passive mixer 713, the first local oscillator (LO) circuit 714, the intermediate frequency (IF) filter 722, the second passive mixer 724, the second local oscillator (LO) circuit 726, the receive compensation circuit 318, and the shared magnetic circuit 715 may comprise shared circuitry 710. As used herein, the terms "shared circuitry" and "shared circuit" refer to circuits and circuit elements that may be shared by a transmit path 746 and by a receive path 748.

In an exemplary embodiment, the I BBF circuit 704 may comprise an in-phase (I) receive (RX) BBF circuit 706 and an in-phase (I) transmit (TX) BBF circuit 708. In an exemplary embodiment, the Q BBF circuit 705 may comprise a (Q) receive (RX) BBF circuit 707 and a (Q) transmit (TX) BBF circuit 709. The I RX BBF circuit 706 and the Q RX BBF circuit 707 may be an example of the lowpass filters 264a and 264b of FIG. 2. The I TX BBF circuit 708 and the Q TX BBF circuit 709 may be an example of the lowpass filters 232a and 232b of FIG. 2. In an exemplary embodiment, the I BBF circuit 704 and the Q BBF circuit 709 may comprise all or part of a bi-quadrature (BiQuad) filter. The circuits 706-709 may be configured similar to or may be examples o the circuits 606-609.

In an exemplary embodiment, the I passive mixer 712 and the Q passive mixer 713 exhibit a non-linear (e.g. exponential) characteristic. A passive mixer may use one or more diodes or other elements and rely on the element's non-linear relationship between voltage and current, to provide a multiplying function.

In an exemplary embodiment, the I passive mixer 712 and the Q passive mixer 713 may be examples of the upconverter 240 and the downconverter 260 of FIG. 2. In an exemplary embodiment, the first LO circuit 714 and the second LO circuit 726 may be an example of the LO generator circuit 295 of FIG. 2.

In an exemplary embodiment, the I RX BBF 706 may be coupled to the I passive mixer 712 by switches ($S_{RX}$) 752 and 754. Similarly, the I TX BBF 708 may be coupled to the I passive mixer 712 by switches ($S_{TX}$) 756 and 758.

In an exemplary embodiment, the Q RX BBF 707 may be coupled to the Q passive mixer 713 by switches ($S_{RX}$) 753 and 755. Similarly, the Q TX BBF 709 may be coupled to the Q passive mixer 713 by switches ($S_{TX}$) 757 and 759.

In an exemplary embodiment, the switch 752 may couple the I RX BBF 706 to the node 762 and the switch 756 may couple the I TX BBF 708 to the node 762. In an exemplary embodiment, the switch 754 may couple the I RX BBF 706 to the node 764 and the switch 758 may couple the I TX BBF 708 to the node 764.

In an exemplary embodiment, the switch 753 may couple the Q RX BBF 707 to the node 766 and the switch 757 may couple the Q TX BBF 709 to the node 766. In an exemplary embodiment, the switch 755 may couple the Q RX BBF 707 to the node 768 and the switch 759 may couple the Q TX BBF 709 to the node 768.

The I passive mixer 712 may be coupled to a node 719 over differential communication line 715a and may be coupled to a node 721 over differential communication line 715b. The Q passive mixer 713 may be coupled to the node 721 over differential communication line 717a and may be coupled to the node 719 over differential communication line 717b.

The nodes 719 and 721 may also be coupled to the IF filter 722. The IF filter 722 may be coupled to the second passive mixer 724 over differential communication lines 723a and 723b. The second passive mixer 724 may be coupled to the receive compensation circuit 318 and to a shared magnetic circuit 715 over differential communication lines 727a and 727b. In an exemplary embodiment, the shared magnetic circuit 715 may be implemented in a variety of ways, such as shared magnetic circuit 420 or shared magnetic circuit 450 as shown in FIG. 4.

In an exemplary embodiment, the shared magnetic circuit 715 may be coupled to the LNA/LNTA 742 by switches ($S_{RX}$) 772 and 774. Similarly, the shared magnetic circuit 715 may be coupled to the DA 744 by switches ($S_{TX}$) 776 and 778.

In an exemplary embodiment, the switch 772 may couple the LNA/LNTA 742 to the node 773 and the switch 774 may couple the LNA/LNTA 742 to the node 775. In an exemplary embodiment, the switch 776 may couple the DA 744 to the node 773 and the switch 778 may couple the DA 744 to the node 775.

In an exemplary embodiment, the switches 752, 754, 756 and 758; the switches 753, 755, 757 and 759; and the switches 772, 774, 776 and 778 may be controlled by a signal from the data processor 210 (FIG. 2), or by another controller.

In an exemplary embodiment, in the transmit direction, the I passive mixer 712 and the Q passive mixer 713 may be configured to convert the communication signal on nodes 762 and 764, and nodes 766 and 768 between a baseband signal and a intermediate frequency (IF) signal determined by the frequency of the signals provided to the I passive mixer 712 and the Q passive mixer 713 by the first LO circuit 714. In an exemplary embodiment, the first LO circuit 714 provides in-phase (I) LO signals to the I passive mixer 712 and provides quadrature (Q) LO signals to the Q passive mixer 713. In an exemplary embodiment, the I LO signals may be offset by 90 degrees from the Q LO signals; however, other degrees of offset are possible.

The intermediate frequency signal on nodes 719 and 721 is then filtered by the IF filter 722 to remove unwanted products, and then provided over differential communication lines 723a and 723b. The IF signal on differential communication lines 723a and 723b is then provided to the second passive mixer 724, which may be configured to convert the intermediate frequency communication signal on differential communication lines 723a and 723b to a radio frequency (RF) signal having a frequency determined by the frequency of the signals provided by the second LO circuit 726. The transmit signal is provided to the shared magnetic circuit 715 over differential communication lines 727a and 727b.

In an exemplary embodiment, in the receive direction, a receive signal is provided from the LNA/LNTA 742 to the shared magnetic circuit 715 at nodes 773 and 775. In the receive direction, in an exemplary embodiment, the shared magnetic circuit 715 behaves as a current step-up circuit or a current maintenance circuit, and provides the receive signal to the receive compensation circuit 318 and to the second passive mixer 724 over differential communication lines 727a and 727b.

In this example, and referring back to FIG. 3, in receive mode, the switches 336 and 338 in the receive compensation circuit 318 are also controlled to be conductive, coupling the capacitances 332 and 334 to the differential signal lines 316a and 316b, respectively. In receive mode, the capacitances 332 and 334 resonate with the inductance of the first side 324 of the transformer 322 so that the transformer 322 behaves like a current source.

The second passive mixer 724 downconverts the signal on differential communication lines 727a and 727b from an RF signal to an intermediate frequency (IF) signal, the frequency of which is determined by the frequency of the signal provided by the second LO circuit 726. The IF signal from the second passive mixer 724 is provided over differential communication lines 723a and 723b to the IF filter 722, which removes unwanted products. The filtered receive signal is then provided to the I passive mixer 712 over differential communication lines 716a and 716b and to the Q passive mixer 713 over differential communication lines 717a and 717b. The I passive mixer 712 and the Q passive mixer 713 downconvert the RF signal on differential communication lines 716a and 716b and 717a and 717b to a baseband (or near baseband) signal, the frequency of which is determined by the frequency of the signal provided by the first LO circuit 714. The baseband signal is then provided to the BBF circuit 704 and the BBF circuit 705 for further processing.

In an exemplary embodiment, when the transceiver portion 700 is in transmit mode, the switches 756, 758, 757, 759, 776 and 778 may be controlled to be conductive, while the switches 752, 754, 753, 755, 772 and 774 may be controlled to be nonconductive, and a transmit signal is communicated from the I TX BBF 708 and the Q TX BBF 709 to the I mixer 712 and Q mixer 713, upconverted to an IF signal by the I passive mixer 712 and the Q passive mixer 713, filtered by the IF filter 722, upconverted to an RF signal by the second passive mixer 724, and provided to driver amplifier 744 through the shared magnetic circuit 715.

In an exemplary embodiment, the switches 756, 758, 757, 759, 776 and 778 may be controlled to be conductive (and the switches 752, 754, 753, 755, 772 and 774 may be controlled to be nonconductive), when the transceiver portion 700 is in transmit mode and a voltage-mode signal is traversing the transmit path 746. In the example where the transceiver portion 700 is in transmit mode and a voltage-mode signal is traversing the transmit path 746, the shared magnetic circuit 715 behaves as a voltage step-up circuit, providing a voltage signal to the driver amplifier 744.

In an exemplary embodiment, when the transceiver portion 700 is in receive mode, the switches 752, 754, 753, 755, 772 and 774 may be controlled to be conductive, while the switches 756, 756, 757, 759, 776 and 778 may be controlled to be nonconductive, and a receive signal is communicated from the LNA/LNTA 742 to the second passive mixer 724 through the receive compensation circuit 318 and the shared magnetic circuit 715, then to the IF filter 722 and then to the I passive mixer 712 and the Q passive mixer 713. The I passive mixer 712 and the Q passive mixer 713 downconvert the receive signal and passes the downconverted signal to the I RX BBF 706 and the Q RX BBF 707.

In an exemplary embodiment, the switches 752, 754, 753, 755, 772 and 774 may be controlled to be conductive (and the switches 756, 758, 757, 759, 776 and 778 may be controlled to be nonconductive), when the transceiver portion 700 is in receive mode and a current-mode signal is traversing the receive path 748. In the example where the transceiver portion 700 is in receive mode and a current-mode signal is traversing the receive path 748, the shared magnetic circuit 715 behaves as a current step-up circuit, or current maintenance circuit, providing a current signal to the second passive mixer 724, IF filter 722, I passive mixer 712 and the Q passive mixer 713.

FIG. 8 is a block diagram of a portion of a transceiver in accordance with an exemplary embodiment of the disclosure. In the exemplary embodiment shown in FIG. 8, the transceiver portion 800 is a direct-conversion transceiver. In an exemplary embodiment, the transceiver portion 800 is similar to the transceiver portion 300 of FIG. 3; however, FIG. 8 depicts a single-ended receive path and a differential transmit path.

In an exemplary embodiment, the transceiver portion 800 includes a baseband filter (BBF) circuit 804, a passive mixer 812, a local oscillator (LO) circuit 814, the receive compensation circuit 318, a shared magnetic circuit 815, and a front end circuit 840 having a low noise amplifier (LNA) 842 and a driver amplifier 844. In an exemplary embodiment, the LNA 842 may also be implemented as a low noise transconductance amplifier (LNTA), and may also be referred to as a gm cell. In an exemplary embodiment, the low noise amplifier (LNA) 842 and the driver amplifier 844 may be implemented together in a radio frequency (RF) front end module and/or on the same die, or may be implemented separately. In the exemplary embodiment shown in FIG. 8, the LNA 842 may be implemented as a single-ended device.

In an exemplary embodiment, the passive mixer 812, the local oscillator (LO) circuit 814, the receive compensation circuit 818, and the shared magnetic circuit 815 may comprise shared circuitry 810. As used herein, the terms "shared circuitry" and "shared circuit" refer to circuits and circuit elements that may be shared by a transmit path 846 and by a receive path 848. Sharing circuit elements, such as the passive mixer 812, the local oscillator (LO) circuit 814, and the shared magnetic circuit 815 may significantly reduce the amount of area consumed on a circuit board by these components, reduce power consumption, and/or lower the cost of producing the circuit.

In an exemplary embodiment, the BBF circuit 804 may comprise a receive (RX) BBF circuit 806 and a transmit (TX) BBF circuit 808. The RX BBF circuit 806 may be an example of the lowpass filters 264a and 264b of FIG. 2. The TX BBF circuit 808 may be an example of the lowpass filters 232a and 232b of FIG. 2. In an exemplary embodiment, the BBF filter circuit 804 may comprise all or part of a bi-quadrature (BiQuad) filter. In the example shown in FIG. 8, the RX BBF 806 and the TX BBF 808 in the BBF circuit 804 are shown in a non-quadrature arrangement for simplicity. In an exemplary embodiment, the RX BBF 806 and the TX BBF 808 may be similar to the RX BBF 306 and the TX BBF 308, respectively, of FIG. 3.

In an exemplary embodiment, the passive mixer 812 exhibits a non-linear (e.g. exponential) characteristic. A passive mixer may use one or more diodes or other elements and rely on the element's non-linear relationship between voltage and current, to provide a multiplying function. In an exemplary embodiment, the passive mixer 812 may be configured as a voltage mixer configured to operate on a voltage input signal and provide a voltage output signal.

In an exemplary embodiment, the passive mixer 812 may be an example of the upconverter 240 and the downconverter 260 of FIG. 2. In an exemplary embodiment, the LO circuit 814 may be an example of the LO generator circuits 280, 290 of FIG. 2.

In an exemplary embodiment, the RX BBF 806 may be coupled to the passive mixer 812 by switches ($S_{RX}$) 852 and 854. Similarly, the TX BBF 808 may be coupled to the passive mixer 812 by switches ($S_{TX}$) 856 and 858.

In an exemplary embodiment, the switch 852 may couple the RX BBF 806 to the node 862 and the switch 856 may couple the TX BBF 808 to the node 862. In an exemplary embodiment, the switch 854 may couple the RX BBF 806 to the node 864 and the switch 858 may couple the TX BBF 808 to the node 864.

The passive mixer 812 may be coupled to a receive compensation circuit 318 and to a shared magnetic circuit 815 over differential communication lines 816a and 816b.

In an exemplary embodiment, the shared magnetic circuit 815 may be implemented in a variety of ways, and in FIG. 8 may be implemented using the shared magnetic circuit 430 of FIG. 4. For example, the shared magnetic circuit 815 may be configured to couple an unused terminal to ground (e.g., through an impedance, as one side of a balun, etc.) in a single-ended (receive) configuration, and to couple all terminals to various signal processing components in a differential (transmit) configuration.

In an exemplary embodiment shown in FIG. 8, the shared magnetic circuit 815 may be coupled to the LNA/LNTA 842 by a single switch ($S_{RX}$) 872 because in this exemplary embodiment, the LNA/LNTA 842 is implemented as a single-ended device. The shared magnetic circuit 815 may be coupled to the DA 844 by switches ($S_{TX}$) 876 and 878.

In an exemplary embodiment, the switch 872 may couple the LNA/LNTA 842 to the node 873. In an exemplary embodiment, the switch 876 may couple the DA 844 to the node 873 and the switch 878 may couple the DA 344 to the node 875.

In an exemplary embodiment, the switches 852, 854, 856 and 858; and the switches 872, 876 and 878 may be controlled by a signal from the data processor 210 (FIG. 2), or by another controller.

In an exemplary embodiment, in the transmit direction, the passive mixer 812 may be configured to convert the communication signal on nodes 862 and 864 between a baseband signal and a radio frequency (RF) signal determined by the frequency of the signals provided to the passive mixer 812 by the LO circuit 814. The RF signal on differential communication lines 816a and 816b is then provided to the shared magnetic circuit 815 and thereafter provided to the DA 844 as a differential signal over communication lines 817a and 817b.

In an exemplary embodiment, in the receive direction, a receive signal is provided from the LNA/LNTA 842 to the shared magnetic circuit 815 at node 873 and over communication line 817a as a single-ended signal. In the receive direction, the shared magnetic circuit 815 may be implemented using the circuitry 430 of FIG. 4B to convert the single-ended receive signal on connection 873 to differential signals on connections 816a and 816b as described above, and to provide the differential receive signals to the receive compensation circuit 318 and then to the passive mixer 812 over differential communication lines 816a and 816b.

The receive signal is then provided to the passive mixer 812 over differential communication lines 816a and 816b. The passive mixer 812 downconverts the RF signal on differential communication lines 816a and 816b to a baseband (or near baseband) signal, the frequency of which is determined by the frequency of the signal provided by the LO circuit 814. The baseband signal is then provided to the BBF circuit 804 for further processing.

In an exemplary embodiment, when the transceiver portion 800 is in transmit mode, the switches 856, 858, 876 and 878 may be controlled to be conductive, while the switches 852, 854 and 872 may be controlled to be nonconductive, and a transmit signal is communicated from the TX BBF 808 to the mixer 812, upconverted by the mixer 812 and provided to driver amplifier 844 through the shared magnetic circuit 815.

In an exemplary embodiment, the switches 856, 858, 876 and 878 may be controlled to be conductive (and the switches 852, 854 and 872 may be controlled to be noncon- ductive), when the transceiver portion 800 is in transmit mode and a voltage-mode signal is traversing the transmit path 846. In the example where the transceiver portion 800 is in transmit mode and a voltage-mode signal is traversing the transmit path 846, the shared magnetic circuit 815 behaves as a voltage step-up circuit, providing a voltage signal to the driver amplifier 844.

In an exemplary embodiment, when the transceiver portion 800 is in receive mode, the switches 852, 854 and 872 may be controlled to be conductive, while the switches 856, 856, 876 and 878 may be controlled to be nonconductive, and a receive signal is communicated from the LNA/LNTA 842 to the mixer 812 through the shared magnetic circuit 815. The mixer 812 downconverts the receive signal and passes the downconverted signal to the RX BBF 806.

In an exemplary embodiment, the switches 852, 854 and 872 may be controlled to be conductive (and the switches 856, 858, 876 and 878 may be controlled to be nonconductive), when the transceiver portion 800 is in receive mode and a current-mode signal is traversing the receive path 848. In the example where the transceiver portion 800 is in receive mode and a current-mode signal is traversing the receive path 848, the shared magnetic circuit 815 behaves as a current step-up circuit, or current maintenance circuit, providing a current signal to the passive mixer 812.

While FIG. 8 illustrates a direct conversion architecture having a single-ended output from the LNA 842 and a differential input to the DA 844, other configurations are possible. For example, the output from the LNA 842 may be differential and the input to the DA 844 may be single-ended. As another example, both the output of the LNA 842 and the input of the DA 844 may be single-ended. In such example, the node 475 may be persistently coupled to ground. Further, a super-het architecture and/or an architecture in which the output of the mixer 812 is split into I and Q signals may be implemented (e.g., as described above with respect to various figures).

Figure 9:
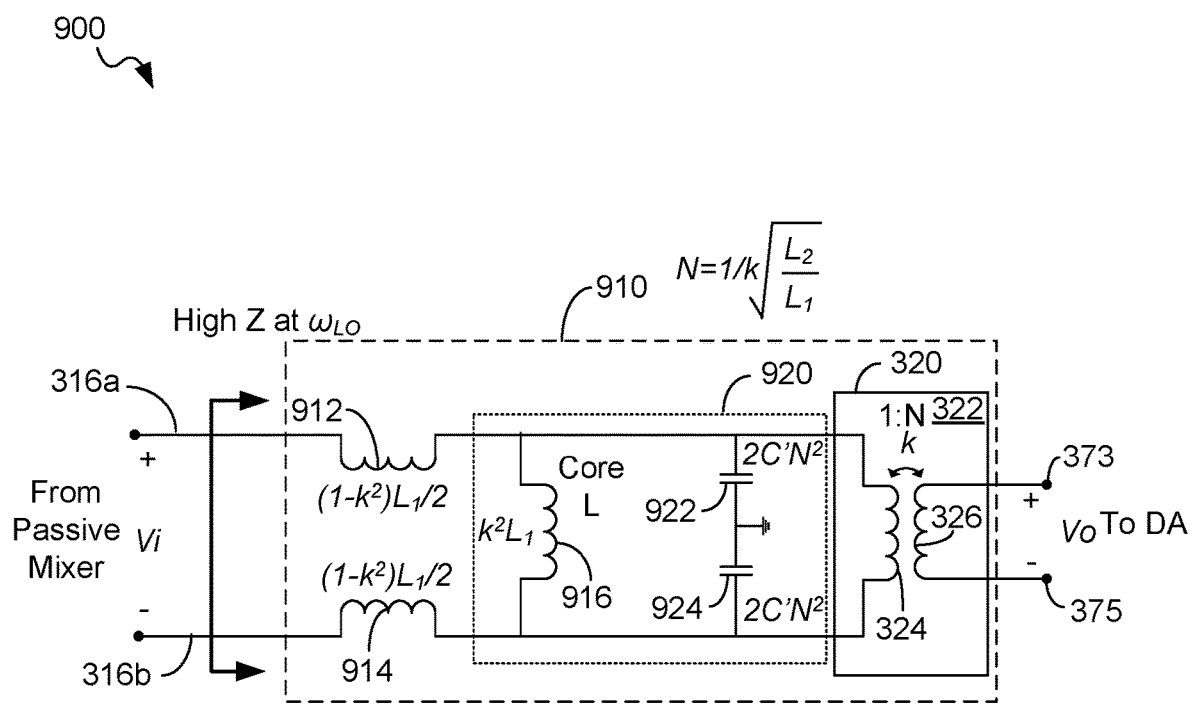
FIG. 9 is a schematic diagram showing a transmit voltage mode transformer model of a portion of a transceiver in accordance with an exemplary embodiment of the disclosure.

FIG. 9 is a schematic diagram 900 showing a transmit voltage mode transformer model of a portion of a transceiver in accordance with an exemplary embodiment of the disclosure. In an exemplary embodiment, the transformer model 910 uses the transformer 322 shown in FIG. 3 to illustrate the shared magnetic circuit 320; however, any of the magnetic circuits shown in FIG. 4 may also be used. The differential communication lines 316a and 316b, and the nodes 373 and 375 are shown for reference. An input voltage, Vi, appears across the differential communication lines 316a and 316b and an output voltage, Vo, appears across the nodes 373 and 375. The transformer 322 comprises a ratio of 1:N and a coupling factor, k. As used herein, the term "N" refers to a turn ratio of a transformer core when viewed from the first side of the transformer, and the term "N'" refers to a turn ratio of a transformer core when viewed from the second side of the transformer. A value of N may be determined by:

$$N = 1/k\sqrt{\frac{L_2}{L_1}}$$

The transformer model 910 also shows a leakage inductance shown using inductances 912 and 914; and a core inductance shown using inductance 916. In an exemplary embodiment, the value of each of the inductances 914 and 914 may be $(1-k^2) L_1/2$, and the value of the inductance 916 may be $k^2L_1$, where $L_1$ refers to the inductance of the first side 324 of the transformer 322.

The transformer model 910 also comprises capacitances 922 and 924 each having a value $2C'N^2$. The value of $2C'N^2$ represents an equivalent driver amplifier input capacitance value.

In an exemplary embodiment, the core inductance 916 and the capacitances 922 and 924 form a resonant circuit 920 that resonates at $\omega^2LO$ and that exhibits a shunt resistance, Rsh (see FIG. 10), equal to $\omega_{LO}k^2L_1Q$, where "k" is the coupling factor of the transformer 322 and Q is a quality factor of the first side 324 and the second side 326 of the transformer 322.

Figure 10:
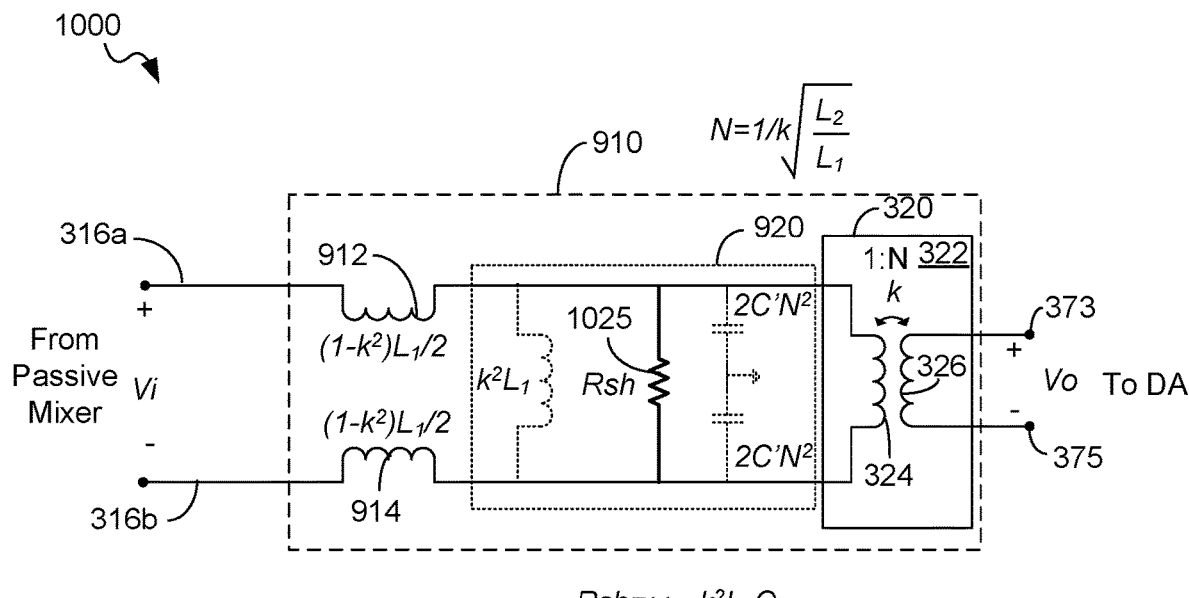
FIG. 10 is a schematic diagram showing the transmit voltage mode transfer function of the transformer model of the portion of the transceiver of FIG. 9.

FIG. 10 is a schematic diagram 1000 showing the transmit voltage mode transfer function of the transformer model of the portion of the transceiver of FIG. 9. In FIG. 10, the resonant circuit 920 (FIG. 9) is shown as having a shunt resistance, Rsh, 1025 that is Rsh=$\omega_{LO}k^2L_1Q$. The transfer function is:

$$\frac{Vo}{Vi} = \frac{\omega_{LO}k^2L_1Q}{(1-k^2)L_1 + R + \omega_{LO}k^2L_1Q} \cdot \frac{1}{k}\sqrt{\frac{L_2}{L_1}}$$

In an exemplary embodiment, this illustrates that to achieve a higher transmit voltage mode gain, it is desirable to increase the value of L2/L1, where L2 is the inductance of the second side 326 of the transformer 322, and also increase the value of the coupling factor, k, as mentioned above.

Figure 11:
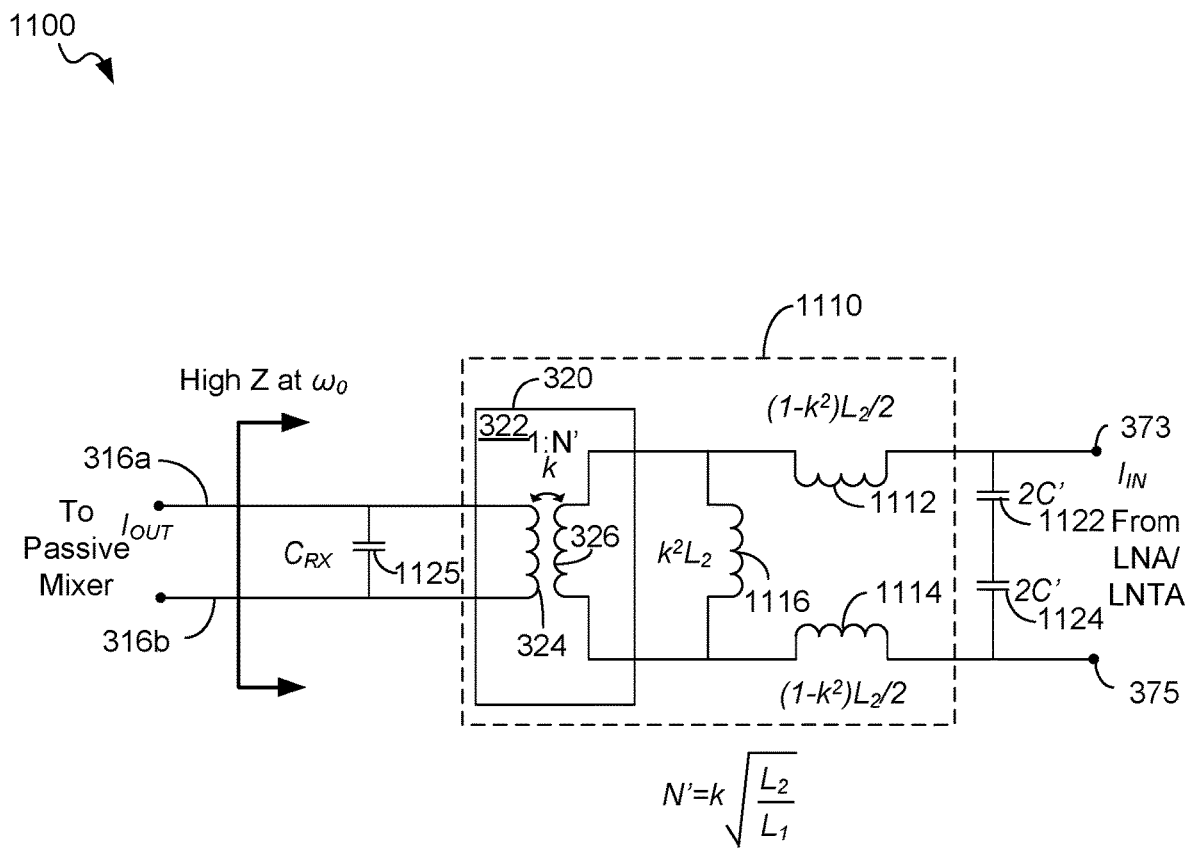
FIG. 11 is a schematic diagram showing a receive current mode transformer model of a portion of a transceiver in accordance with an exemplary embodiment of the disclosure.

FIG. 11 is a schematic diagram 1100 showing a receive current mode transformer model of a portion of a transceiver in accordance with an exemplary embodiment of the disclosure. In an exemplary embodiment, the transformer model 1110 uses the transformer 322 shown in FIG. 3 to illustrate the shared magnetic circuit 320; however, any of the magnetic circuits shown in FIG. 4 may also be used. The differential communication lines 316a and 316b, and the nodes 373 and 375 are shown for reference. An input current, $I_{IN}$, appears at the node 373, and an output current, $I_{OUT}$, appears at the connection 316a. The transformer 322 comprises a ratio of 1:N' and a coupling factor, k. A value of N' may be determined by:

$$N' = k\sqrt{\frac{L_2}{L_1}}$$

The transformer model 1110 also shows a leakage inductance shown using inductances 1112 and 1114; and a core inductance shown using inductance 1116. In an exemplary embodiment, the value of each of the inductances 1112 and 1114 may be $(1-k^2)L_2/2$, and the value of the inductance 1116 may be $k^2L_2$, where L2 refers to the inductance of the second side 326 of the transformer 322.

The transformer model 1110 also comprises capacitances 1122 and 1124 each having a value 2C'. The value of 2C' represents an equivalent driver amplifier input capacitor value.

In an exemplary embodiment, the transformer model 1110 also comprises a capacitance 1125, referred to as $C_{RX}$. The capacitance $C_{RX}$ 1125 is added across the first side 324 of the transformer 322 to provide a resonance at Wo and thus present a high impedance, Z, for the passive mixer (not shown in FIG. 11). In an exemplary embodiment, the capacitance $C_{RX}$ 1125 may represent the receive compensation circuit 318 shown in FIG. 3.

Figure 12A:
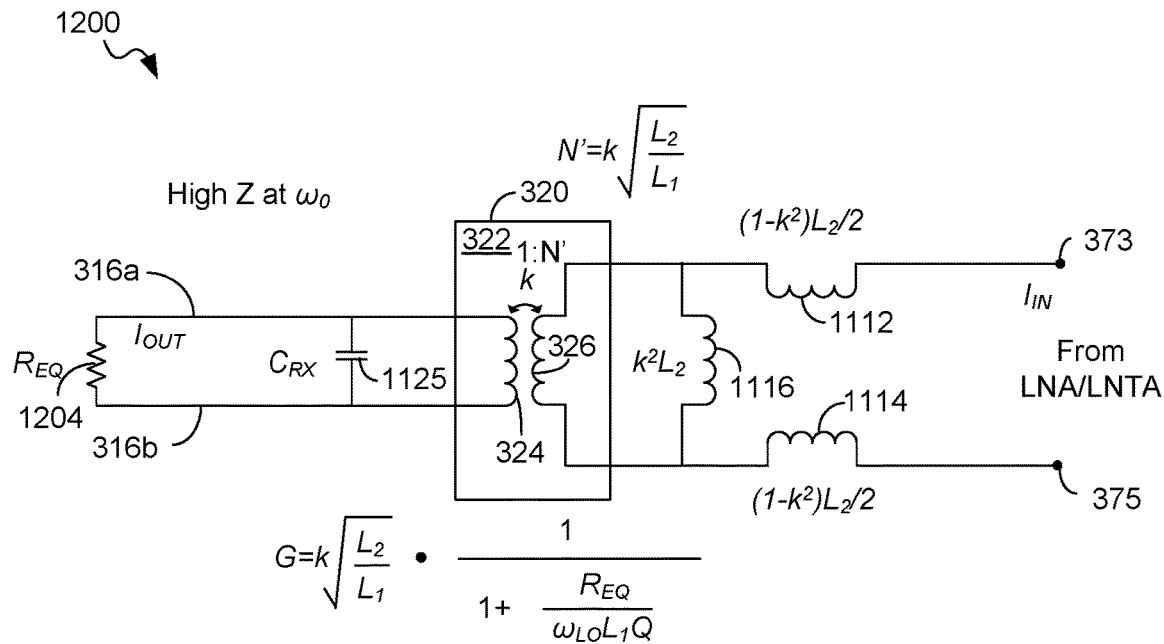
FIG. 12A is a schematic diagram showing the receive current mode transfer function for LNA output gain (gm) of the transformer model of the portion of the transceiver of FIG. 11.

FIG. 12A is a schematic diagram 1200 showing the receive current mode transfer function for LNA output gain (gm) of the transformer model of the portion of the transceiver of FIG. 11.

In an exemplary embodiment, the output current, $I_{OUT}$, is shown flowing through a resistance 1204, referred to as $R_{EQ}$. The resistance 1204 represents an impedance looking into the RX BBF 306 (FIG. 3).

In an exemplary embodiment, the gain (gm) of the LNA may be determined according to:

$$G = k\sqrt{\frac{L_2}{L_1}} \cdot \frac{1}{1 + \frac{R_{EQ}}{\omega_{LO}L_1Q}}$$

In an exemplary embodiment, similar to achieving a higher transmit voltage mode gain, this illustrates that to achieve a higher receive current mode gain, it is similarly desirable to increase the value of L2/L1, where L2 is the inductance of the second side 326 of the transformer 322, and also increase the value of the coupling factor, k.

Figure 12B:
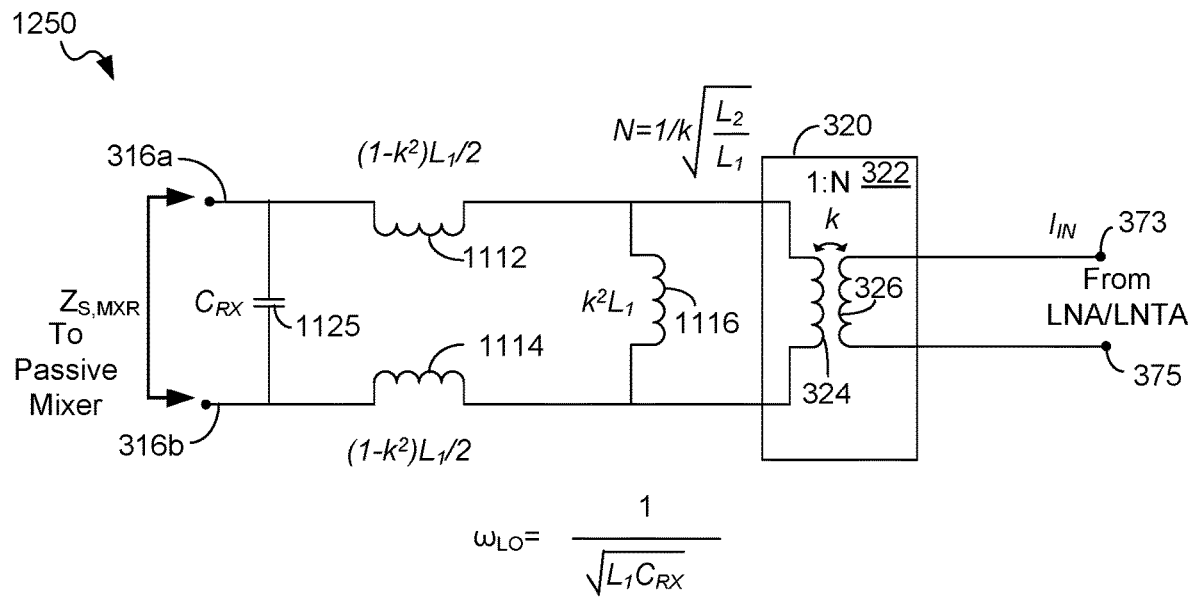
FIG. 12B is a schematic diagram showing the receive current mode transfer function for a mixer input equivalent circuit of the portion of the transceiver of FIG. 11.

FIG. 12B is a schematic diagram 1250 showing the receive current mode transfer function for a mixer input equivalent circuit of the portion of the transceiver of FIG. 11.

In an exemplary embodiment, the impedance, $Z_{S,MXR}$, exhibited at the differential communication lines 316a and 316b is created by the capacitance $C_{RX}$ 1125 that provides a resonance at $\omega_0$ and thus present a high impedance, Z, for the passive mixer (not shown in FIG. 11), as given by:

$$\omega_{LO} = \frac{1}{\sqrt{L_1 C_{RX}}}$$

Figure 13:
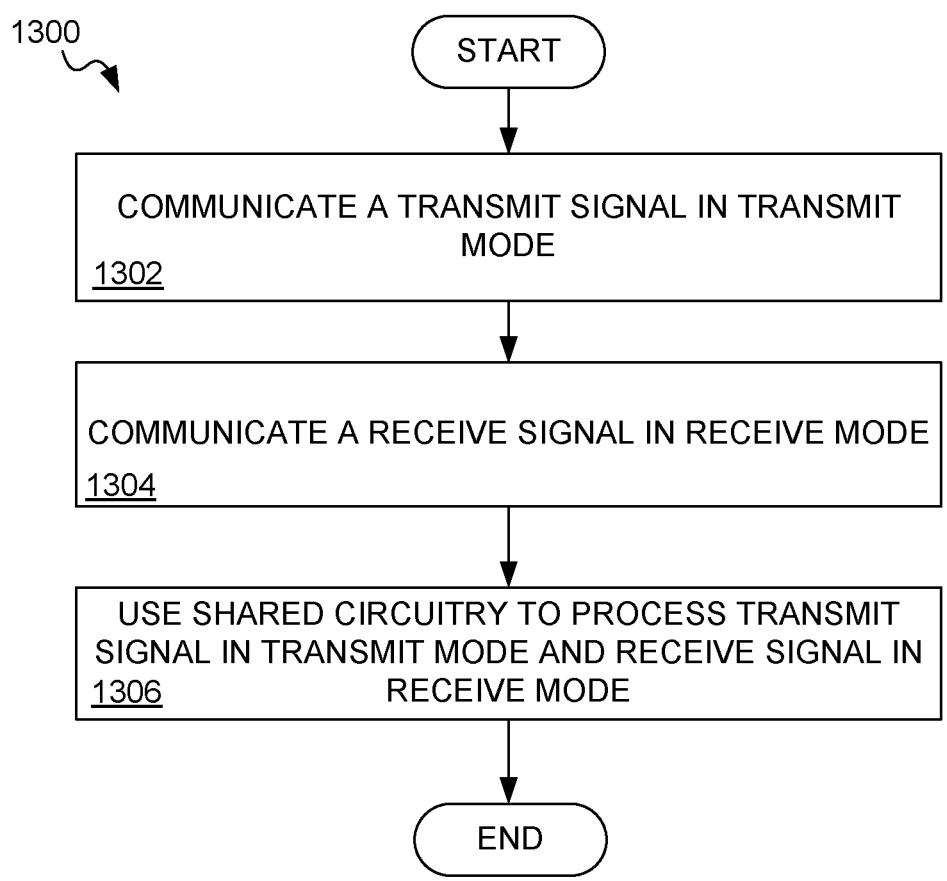
FIG. 13 is a flow chart describing an example of a method for sharing circuitry between a transmit path and a receive path in accordance with an exemplary embodiment of the disclosure.

FIG. 13 is a flow chart 1300 describing an example of a method for sharing circuitry between a transmit path and a receive path. The blocks in the method 900 can be performed in or out of the order shown, and in some embodiments, can be performed at least in part in parallel.

In block 1302, a transmit signal is communicated in a transmit mode. For example, the transmitter 230 of FIG. 2, or any of the transmit components in the transceiver portions of FIG. 3 and FIG. 5 through FIG. 8 are operated in a transmit mode to communicate a transmit signal.

In block 1304, a receive signal is communicated in a receive mode. For example, the receiver 250 of FIG. 2, or any of the receive components in the transceiver portions of FIG. 3 and FIG. 5 through FIG. 8 are operated in a receive mode to communicate a receive signal.

In block 1306, shared circuitry is used to process the transmit signal in the transmit mode and the receive signal in the receive mode. For example, the shared circuitry of FIG. 3 and FIG. 5 through FIG. 8 may be used to process a transmit signal in the transmit mode and to process the receive signal in the receive mode. For example, one or more passive mixers, LO circuitry and magnetic circuitry may be used in transmit mode and in receive mode. The shared circuitry may be coupled between an LNA and a first BBF, and further between a second BBF and a driver amplifier.

Figure 14:
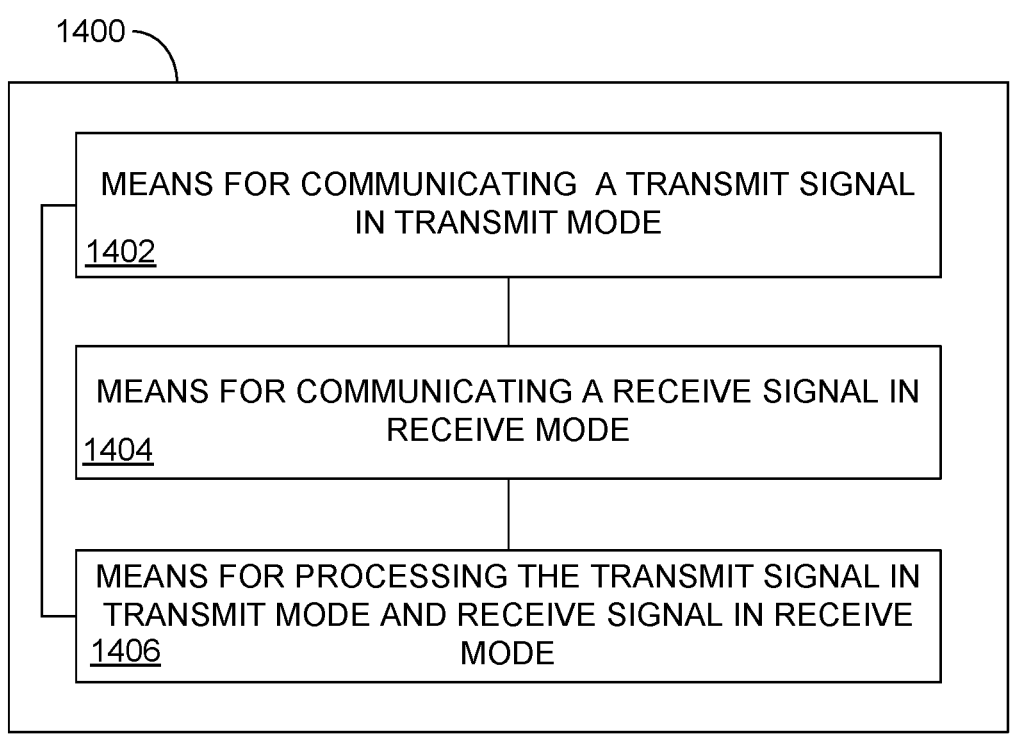
FIG. 14 is a functional block diagram of an apparatus for sharing circuitry between a transmit path and a receive path in accordance with an exemplary embodiment of the disclosure.

FIG. 14 is a functional block diagram of an apparatus for sharing circuitry between a transmit path and a receive path in accordance with an exemplary embodiment of the disclosure.

The apparatus 1400 comprises means 1402 for communicating a transmit signal in a transmit mode. In certain embodiments, the means 1402 for communicating a transmit signal in a transmit mode can be configured to perform one or more of the functions described in operation block 1302 of method 1300 (FIG. 13). In an exemplary embodiment, the means 1402 for communicating a transmit signal in a transmit mode may comprise any of the transmit components in the transceiver portions of FIG. 3 and FIG. 5 through FIG. 8, for example when configured in a transmit mode.

The apparatus 1400 also comprises means 1404 for communicating a receive signal in a receive mode. In certain embodiments, the means 1404 for communicating a receive signal in a receive mode can be configured to perform one or more of the functions described in operation block 1304 of method 1300 (FIG. 13). In an exemplary embodiment, the means 1404 for communicating a receive signal in a receive mode may comprise any of the receive components in the transceiver portions of FIG. 3 and FIG. 5 through FIG. 8, for example when configured in a receive mode.

The apparatus 1400 also comprises means 1406 for processing the transmit signal in the transmit mode and the receive signal in receive mode. In certain embodiments, the means 1406 for processing the transmit signal in the transmit mode and the receive signal in receive mode can be configured to perform one or more of the functions described in operation block 1306 of method 1300 (FIG. 13). In an exemplary embodiment, the means 1406 for processing the transmit signal in the transmit mode and the receive signal in receive mode may comprise the shared circuitry of FIG. 3 and FIG. 5 through FIG. 8. For example, one or more passive mixers, LO circuitry, receive compensation circuitry and magnetic circuitry may be used in transmit mode and in receive mode.

Certain aspects described herein include a signal path shared by both transmit and receive functions. For example, a common mixer, LO circuitry, and/or magnetic circuit may be included in the shared signal path. The shared signal path may be coupled between an LNA and a first BBF, and further between a second BBF and a driver or power amplifier. In some such embodiments, a size of circuitry required to perform the transmit and receive functions is decreased without significantly decreasing performance as compared to when separate signal paths are used for the transmit and receive functions. For example, comparable gain and/or noise performance may be achieved in some embodiments as compared to architectures which include separate magnetic (e.g., matching) circuits. Some embodiments described herein may be included in an internet of things (IoT) device, for example to reduce a size, cost, and/or power consumption of the device. Such device may be configured to communication in a WiFi and/or Bluetooth band, and/or in an LTE and/or 5G NR band. Other devices using similar or different communication bands may implement embodiments described herein.

Implementation examples are described in the following numbered clauses:

1. A transceiver circuit, comprising transmit circuitry comprising a transmit baseband filter and a driver amplifier having an output coupled to a power amplifier; receive circuitry comprising a low noise amplifier and a receive baseband filter; mixer circuitry; an a magnetic circuit, wherein the mixer circuitry and the magnetic circuit are coupled between the transmit baseband filter and the driver amplifier, and are further coupled between the low noise amplifier and the receive baseband filter, wherein the mixer circuitry and the magnetic circuit are shared between the transmit circuitry and the receive circuitry in a time division duplexing (TDD) communication system.

2. The transceiver circuit of clause 1, wherein the magnetic circuit is configured to operate as a transmit signal amplification circuit in a transmit mode, and configured to operate as a receive signal amplification circuit in a receive mode.

3. The transceiver circuit of any of clauses 1 or 2, wherein the mixer circuitry comprises a passive mixer and wherein the transceiver circuit further comprises a local oscillator (LO) circuit coupled to the passive mixer, the passive mixer and the LO circuit configured to operate in a direct-conversion communication system.

4. The transceiver circuit of any of clauses 1 or 2, wherein the mixer circuitry comprises a first passive mixer and a second passive mixer, wherein the transceiver circuit further comprises a first local oscillator (LO) circuit coupled to the first passive mixer and a second LO circuit coupled to the second passive mixer, the transceiver circuit configured to operate in a superheterodyne communication system.

5. The transceiver circuit of any of clauses 1 through 4, further comprising a receive compensation circuit configured to resonate with an inductance of the magnetic circuit in a receive mode.

6. The transceiver circuit of any of clauses 1 through 5, wherein the mixer circuitry comprises a passive mixer configured to operate in a voltage mode so that the magnetic circuit operates as a step-up voltage circuit in the transmit mode.

7. The transceiver circuit of any of clauses 1 through 6, wherein the magnetic circuit comprises circuitry configured to communicate differential transmit signals and differential receive signals between the mixer circuitry and the magnetic circuit.

8. The transceiver circuit of any of clauses 1 through 7, wherein the magnetic circuit comprises circuitry configured to communicate differential transmit signals and a single-ended receive signal.

9. The transceiver circuit of clause 8, further comprising a termination impedance selectively coupled to the magnetic circuit, wherein the termination impedance and the magnetic circuit are configured to convert the single-ended receive signal to differential receive signals.

10. The transceiver circuit of any of clauses 1 through 9, further comprising switches that selectively decouple the transmit baseband filter and the receive baseband filter from the mixer circuitry.

11. The transceiver circuit of any of clauses 1 through 10, further comprising switches that selectively decouple the driver amplifier and the power amplifier from the magnetic circuit.

12. A method for communication, comprising communicating a transmit signal in a transmit mode; communicating a receive signal in a receive mode; and using shared circuitry coupled between a low noise amplifier and a first baseband filter and further coupled between a second baseband filter and a driver amplifier to process the transmit signal in the transmit mode and the receive signal in the receive mode.

13. The method for communication of clause 12, further comprising using the shared circuitry in a time division duplexing (TDD) communication system.

14. The method for communication of any of clauses 12 through 13, further comprising implementing the shared circuitry using mixer circuitry and magnetic circuitry and sharing the shared circuitry by transmit circuitry when in a transmit mode and receive circuitry when in a receive mode.

15. The method for communication of any of clauses 12 through 14, further comprising implementing at least a portion of the shared circuitry as a passive mixer and a single local oscillator (LO) circuit operating in a direct-conversion communication system.

16. The method for communication of any of clauses 12 through 14, further comprising implementing at least a portion of the shared circuitry as a first passive mixer, a second passive mixer, a first local oscillator (LO) circuit and a second LO circuit operating in a superheterodyne communication system.

17. The method for communication of any of clauses 12 through 16, further comprising operating at least a portion of the shared circuitry as a current source in the receive mode.

18. The method for communication of any of clauses 12 through 17, further comprising operating at least a portion of the shared circuitry as a step-up voltage circuit in the transmit mode.

19. The method for communication of any of clauses 12 through 18, further comprising configuring the magnetic circuit to communicate differential transmit signals and differential receive signals.

20. The method for communication of any of clauses 12 through 18, further comprising configuring the magnetic circuit to communicate differential transmit signals and a single-ended receive signal.

21. The method for communication of clause 20, further comprising configuring the magnetic circuit to convert the single-ended receive signal to differential receive signals.

22. A device, comprising means for communicating a transmit signal in a transmit mode; means for communicating a receive signal in a receive mode; and means for using shared circuitry coupled between a low noise amplifier and a first baseband filter and further coupled between a second baseband filter and a driver amplifier to process the transmit signal in the transmit mode and the receive signal in the receive mode.

23. The device of clause 22, further comprising means for operating at least a portion of the shared circuitry as a step-up voltage circuit in the transmit mode and as a step-up current circuit in the receive mode.

24. The device of any of clauses 22 through 23, further comprising means for communicating differential transmit signals and one of differential receive signals and a single-ended receive signal.

25. A transceiver circuit, comprising transmit circuitry; receive circuitry; mixer circuitry coupled to the transmit circuitry and the receive circuitry and configured to operate in both a transmit mode and a receive mode; and a magnetic circuit coupled to the transmit circuitry and to the receive circuitry, the magnetic circuit configured to operate as a voltage step-up circuit in the transmit mode, and configured to operate as a current step-up or current maintenance circuit in the receive mode.

26. The transceiver circuit of clause 25, wherein the mixer circuitry and the magnetic circuit are shared between the transmit circuitry and the receive circuitry in a time division duplexing (TDD) communication system.

27. The transceiver circuit of any of clauses 25 through 26, wherein the mixer circuitry comprises a passive mixer configured to operate in a direct-conversion communication system.

28. The transceiver circuit of any of clauses 25 through 26, wherein the mixer circuitry comprises a first passive mixer and a second passive mixer, a first local oscillator (LO) circuit configured to operate in a superheterodyne communication system.

29. The transceiver circuit of any of clauses 25 through 28, wherein the magnetic circuit is configured to communicate differential transmit signals and one of differential receive signals and a single-ended receive signal.

30. The transceiver circuit of clause 29, wherein the magnetic circuit is configured to convert the single-ended receive signal to differential receive signals.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A transceiver circuit, comprising:
   transmit circuitry comprising a transmit baseband filter and a driver amplifier having an output coupled to a power amplifier;
   receive circuitry comprising a low noise amplifier and a receive baseband filter;
   mixer circuitry; and
   a magnetic circuit, wherein the mixer circuitry and the magnetic circuit are coupled between the transmit baseband filter and the driver amplifier, and are further coupled between the low noise amplifier and the receive baseband filter, wherein the mixer circuitry and the magnetic circuit are shared between the transmit circuitry and the receive circuitry in a time division duplexing (TDD) communication system and where the transmit baseband filter is switchably connected to a common node using a first dedicated path in a transmit direction and the receive baseband filter is switchably connected to the common node using a second dedicated path in a receive direction, the common node connected to the mixer circuitry.

2. The transceiver circuit of claim 1, wherein the magnetic circuit is configured to operate as a transmit signal amplification circuit in a transmit mode, and configured to operate as a receive signal amplification circuit in a receive mode.

3. The transceiver circuit of claim 1, wherein the mixer circuitry comprises a passive mixer and wherein the transceiver circuit further comprises a local oscillator (LO) circuit coupled to the passive mixer, the passive mixer and the LO circuit configured to operate in a direct-conversion communication system.

4. The transceiver circuit of claim 1, wherein the mixer circuitry comprises a first passive mixer and a second passive mixer, wherein the transceiver circuit further comprises a first local oscillator (LO) circuit coupled to the first passive mixer and a second LO circuit coupled to the second passive mixer, the transceiver circuit configured to operate in a superheterodyne communication system.

5. The transceiver circuit of claim 1, further comprising a receive compensation circuit configured to resonate with an inductance of the magnetic circuit in a receive mode.

6. The transceiver circuit of claim 1, wherein the mixer circuitry comprises a passive mixer configured to operate in a voltage mode so that the magnetic circuit operates as a voltage step-up circuit in a transmit mode.

7. The transceiver circuit of claim 1, wherein the magnetic circuit comprises circuitry configured to communicate differential transmit signals and differential receive signals between the mixer circuitry and the magnetic circuit.

8. The transceiver circuit of claim 1, wherein the magnetic circuit comprises circuitry configured to communicate differential transmit signals and a single-ended receive signal.

9. The transceiver circuit of claim 8, further comprising a termination impedance selectively coupled to the magnetic circuit, wherein the termination impedance and the magnetic circuit are configured to convert the single-ended receive signal to differential receive signals.

10. The transceiver circuit of claim 1, further comprising switches that selectively decouple the transmit baseband filter and the receive baseband filter from the mixer circuitry.

11. The transceiver circuit of claim 1, further comprising switches that selectively decouple the driver amplifier and the low noise amplifier from the magnetic circuit.

12. A method for communication, comprising:
communicating a transmit signal in a transmit mode;
communicating a receive signal in a receive mode; and
using shared circuitry coupled between a low noise amplifier and a first baseband filter and further coupled between a second baseband filter and a driver amplifier to process the transmit signal in the transmit mode and the receive signal in the receive mode,
wherein the shared circuitry comprises mixer circuitry and magnetic circuitry and where the first baseband filter is switchably connected to a common node using a first dedicated path in a transmit direction and the second baseband filter is switchably connected to the common node using a second dedicated path in a receive direction, the common node connected to the mixer circuitry.

13. The method of claim 12, further comprising using the shared circuitry in a time division duplexing (TDD) communication system.

14. The method of claim 12, further comprising sharing the shared circuitry with transmit circuitry when in the transmit mode and with receive circuitry when in the receive mode.

15. The method of claim 12, further comprising operating at least a portion of the shared circuitry as a current source in the receive mode.

16. The method of claim 12, further comprising operating at least a portion of the shared circuitry as a voltage step-up circuit in the transmit mode.

17. The method of claim 12, further comprising configuring the magnetic circuitry to communicate differential transmit signals and differential receive signals.

18. The method of claim 12, further comprising configuring the magnetic circuitry to communicate differential transmit signals and a single-ended receive signal.

19. The method of claim 18, further comprising configuring the magnetic circuitry to convert the single-ended receive signal to differential receive signals.

20. A device, comprising:
means for communicating a transmit signal in a transmit mode;
means for communicating a receive signal in a receive mode;
means for using shared circuitry including mixer circuitry and magnetic circuitry coupled between a low noise amplifier and a first baseband filter and further coupled between a second baseband filter and a driver amplifier to process the transmit signal in the transmit mode and the receive signal in the receive mode; and
means for communicating differential transmit signals and one of differential receive signals and a single-ended receive signal, and where the first baseband filter is switchably connected to a common node using a first dedicated path in a transmit direction and the second baseband filter is switchably connected to the common node using a second dedicated path in a receive direction, the common node connected to the mixer circuitry.

21. The device of claim 20, further comprising means for operating at least a portion of the shared circuitry as a voltage step-up circuit in the transmit mode and as a current step-up circuit in the receive mode.

22. A transceiver circuit, comprising:
transmit circuitry;
receive circuitry;
mixer circuitry coupled to the transmit circuitry and the receive circuitry and configured to operate in both a transmit mode and a receive mode; and
a magnetic circuit coupled to the transmit circuitry and to the receive circuitry, the magnetic circuit configured to operate as a voltage step-up circuit in the transmit mode, and configured to operate as a current step-up or current maintenance circuit in the receive mode.

23. The transceiver circuit of claim 22, wherein the mixer circuitry and the magnetic circuit are shared between the transmit circuitry and the receive circuitry in a time division duplexing (TDD) communication system.

24. The transceiver circuit of claim 22, wherein the mixer circuitry comprises a passive mixer configured to operate in a direct-conversion communication system.

25. The transceiver circuit of claim 22, wherein the mixer circuitry comprises a first passive mixer and a second passive mixer, wherein the transceiver circuit further comprises a first local oscillator (LO) circuit coupled to the first passive mixer and a second LO circuit coupled to the second passive mixer, the transceiver circuit configured to operate in a superheterodyne communication system.

26. The transceiver circuit of claim 22, wherein the magnetic circuit is configured to communicate differential transmit signals and one of differential receive signals and a single-ended receive signal.

27. The transceiver circuit of claim 26, wherein the magnetic circuit is configured to convert the single-ended receive signal to the differential receive signals.

28. A method for communication, comprising:
communicating a transmit signal in a transmit mode;
communicating a receive signal in a receive mode; and
using shared circuitry coupled between a low noise amplifier and a first baseband filter and further coupled between a second baseband filter and a driver amplifier to process the transmit signal in the transmit mode and the receive signal in the receive mode, wherein the shared circuitry comprises one or more passive mixers and one or more local oscillator (LO) circuits, and where the first baseband filter is switchably connected to a common node using a first dedicated path in a transmit direction and the second baseband filter is switchably connected to the common node using a second dedicated path in a receive direction, the common node connected to the one or more passive mixers.

29. The method of claim 28, wherein the one or more passive mixers comprise at least one passive mixer and the one or more LO circuits comprise at least one LO circuit configured to operate in a direct-conversion communication system.

30. The method of claim 28, wherein the one or more passive mixers comprise a first passive mixer and a second passive mixer, and the one or more LO circuits comprise a first LO circuit and a second LO circuit configured to operate in a superheterodyne communication system.

\* \* \* \* \*